(12) United States Patent
Seo et al.

(10) Patent No.: US 9,978,977 B2
(45) Date of Patent: *May 22, 2018

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Shogo Uesaka, Kanagawa (JP); Ryohei Yamaoka, Kanagawa (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/602,450

(22) Filed: May 23, 2017

(65) Prior Publication Data

US 2017/0263878 A1    Sep. 14, 2017

Related U.S. Application Data

(63) Continuation of application No. 15/186,807, filed on Jun. 20, 2016, now Pat. No. 9,666,825, which is a (Continued)

(30) Foreign Application Priority Data

Oct. 16, 2013  (JP) .................................. 2013-215721
May 15, 2014  (JP) .................................. 2014-101204

(51) Int. Cl.
*H01L 51/50*    (2006.01)
*H01L 51/52*    (2006.01)
(Continued)

(52) U.S. Cl.
CPC ........ *H01L 51/504* (2013.01); *H01L 27/3209* (2013.01); *H01L 51/006* (2013.01); *H01L 51/0052* (2013.01); *H01L 51/0061* (2013.01); *H01L 51/0072* (2013.01); *H01L 51/0074* (2013.01); *H01L 51/0085* (2013.01); (Continued)

(58) Field of Classification Search
CPC ..................................................... H01L 51/504
See application file for complete search history.

(56) References Cited

U.S. PATENT DOCUMENTS 7,906,226 B2   3/2011   Matsuura et al.
8,105,701 B2   1/2012   Matsuura et al.
(Continued)

FOREIGN PATENT DOCUMENTS

JP   2003-187977 A   7/2003
JP   2010-182699 A   8/2010

*Primary Examiner* — Daniel Luke
(74) *Attorney, Agent, or Firm* — Husch Blackwell LLP

(57) ABSTRACT

A light-emitting element with high reliability that can keep favorable characteristics after long-time driving is provided. In addition, a light-emitting device having a long lifetime including the light-emitting element is provided. Moreover, an electronic device and a lighting device having a long lifetime are provided. In a light-emitting element including an EL layer between a pair of electrodes, a light-emitting layer included in the EL layer has a stacked-layer structure which is different from the conventional structure, whereby the light-emitting element can keep favorable characteristics after long-time driving even in the case where carrier balance is changed over time due to driving of the light-emitting element or a light-emitting region is shifted due to the change.

15 Claims, 21 Drawing Sheets

Related U.S. Application Data continuation of application No. 14/513,982, filed on Oct. 14, 2014, now Pat. No. 9,379,345.

(51) Int. Cl.
 *H01L 51/00* (2006.01)
 *H01L 27/32* (2006.01)

(52) U.S. Cl.
 CPC ...... *H01L 51/5278* (2013.01); *H01L 27/3244* (2013.01); *H01L 51/0054* (2013.01); *H01L 51/0059* (2013.01); *H01L 51/5012* (2013.01); *H01L 51/5016* (2013.01); *H01L 51/5056* (2013.01); *H01L 51/5072* (2013.01); *H01L 2251/5361* (2013.01); *H01L 2251/5376* (2013.01); *H01L 2251/5384* (2013.01)

(56) References Cited

U.S. PATENT DOCUMENTS

| | | |
|---|---|---|
| 8,470,455 B2 | 6/2013 | Matsuura et al. |
| 8,653,553 B2 | 2/2014 | Yamazaki et al. |
| 2010/0176389 A1 | 7/2010 | Chun et al. |
| 2012/0205676 A1 | 8/2012 | Seo et al. |
| 2012/0205685 A1 | 8/2012 | Seo et al. |
| 2012/0205686 A1 | 8/2012 | Seo et al. |
| 2012/0242219 A1 | 9/2012 | Seo et al. |
| 2013/0277654 A1 | 10/2013 | Seo et al. |
| 2013/0320377 A1 | 12/2013 | Yamazaki et al. |
| 2014/0042469 A1 | 2/2014 | Seo et al. |
| 2014/0159097 A1 | 6/2014 | Yamazaki et al. |
| 2014/0340888 A1 | 11/2014 | Ishisone et al. |
| 2015/0155510 A1 | 6/2015 | Kawata et al. |

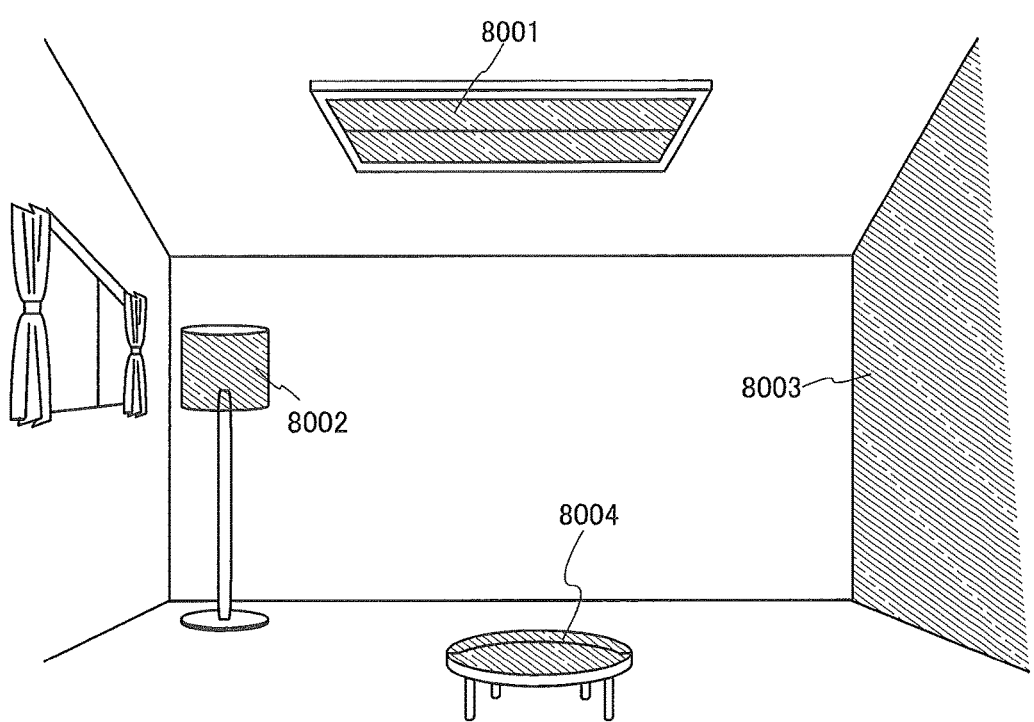

LIGHT-EMITTING ELEMENT, LIGHT-EMITTING DEVICE, ELECTRONIC DEVICE, AND LIGHTING DEVICE

This application is a continuation of copending U.S. application Ser. No. 15/186,807, filed on Jun. 20, 2016 which is a continuation of U.S. application Ser. No. 14/513,982, filed on Oct. 14, 2014 (now U.S. Pat. No. 9,379,345 issued Jun. 28, 2016) which are all incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a lighting device, driving methods thereof, or manufacturing methods thereof. In particular, one embodiment of the present invention relates to a light-emitting element in which an organic compound that emits light by application of an electric field is provided between a pair of electrodes, and also relates to a light-emitting device, an electronic device, and a lighting device including such a light-emitting element.

2. Description of the Related Art

A light-emitting element using an organic compound as a luminous body, which has features such as thinness, lightness, high-speed response, and DC drive at low voltage, is expected to be used in a next-generation flat panel display. In particular, a display device in which light-emitting elements are arranged in matrix is considered to have advantages in a wide viewing angle and excellent visibility over a conventional liquid crystal display device.

It is said that the light emission mechanism of a light-emitting element is as follows: when a voltage is applied between a pair of electrodes with an EL layer including a luminous body provided therebetween, electrons injected from the cathode and holes injected from the anode recombine in the light emission center of the EL layer to form molecular excitons, and energy is released and light is emitted when the molecular excitons relax to the ground state. Singlet excitation and triplet excitation are known as excited states, and it is thought that light emission can be achieved through either of the excited states.

In order to improve element characteristics of such light-emitting elements, improvement of an element structure, development of a material, and the like have been actively carried out (for example, see Patent Document 1).

REFERENCE

Patent Document

[Patent Document 1] Japanese Published Patent Application No. 2010-182699

SUMMARY OF THE INVENTION

In development of a light-emitting element, the reliability is one of the important factors in evaluation of the light-emitting element. Even if the characteristics of the light-emitting element in the initial stage are favorable, in the case where the light-emitting element cannot withstand long-time driving and the lifetime as an element is short, the utility value is low and the commercialization is difficult. Thus, it is desirable to develop a light-emitting element which can keep the favorable characteristics in the initial stage and can withstand driving as long as possible.

One embodiment of the present invention provides a light-emitting element with high reliability which can keep favorable characteristics after long-time driving. Another embodiment of the present invention provides a light-emitting device having a long lifetime in which the light-emitting element is used. Another embodiment of the present invention provides an electronic device and a lighting device each of which has a long lifetime. Another embodiment of the present invention provides a novel light-emitting element, a novel light-emitting device, or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting element including an EL layer between a pair of electrodes. A light-emitting layer included in the EL layer has a stacked-layer structure which is different from the conventional structure, whereby the light-emitting element can keep favorable characteristics after long-time driving even in the case where carrier balance is changed over time due to driving of the light-emitting element or a light-emitting region is shifted due to the change.

Specifically, in the case where the light-emitting layer included in the EL layer of the light-emitting element has a stacked-layer structure and the stacked light-emitting layers contain different light-emitting materials, a light-emitting layer having the same structure as that of a light-emitting layer that contains a light-emitting material exhibiting emission at a short wavelength is further provided, and a light-emitting layer that contains a light-emitting material exhibiting emission at a long wavelength is sandwiched between the two light-emitting layers each of which contains a light-emitting material exhibiting emission at a short wavelength. As a result, even in the case where the light-emitting region is shifted due to the change in carrier balance in each stacked light-emitting layer or between the light-emitting layers, another light-emitting layer can compensate for the change and the stable state in the whole light-emitting layer can be kept; thus, a light-emitting element that can keep the favorable characteristics after long-time driving can be obtained.

Thus, one embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. Light emission obtained from the first light-emitting layer and light emission obtained from the third light-emitting layer has the same light emission color and is exhibited at a shorter wavelength than light emission obtained from the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. The light-emitting materials of the first light-emitting layer and the third light-emitting layer are the same and have an emission peak at a shorter wavelength than that of the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. The hole-transport materials of the first light-emitting layer, the second light-emitting layer, and the third light-emitting layer are the same, and the electron-transport materials of the first light-emitting layer, the second light-emitting layer, and the third light-emitting layer are the same. Light emission obtained from the first light-emitting layer and light emission obtained from the third light-emitting layer has the same light emission color and is exhibited at a shorter wavelength than light emission obtained from the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. The hole-transport materials of the first light-emitting layer, the second light-emitting layer, and the third light-emitting layer are the same, and the electron-transport materials of the first light-emitting layer, the second light-emitting layer, and the third light-emitting layer are the same. The light-emitting materials of the first light-emitting layer and the third light-emitting layer are the same and have an emission peak at a shorter wavelength than that of the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. A combination of the hole-transport material and the electron-transport material in the light-emitting layer forms an exciplex. Light emission obtained from the first light-emitting layer and light emission obtained from the third light-emitting layer has the same light emission color and is exhibited at a shorter wavelength than light emission obtained from the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. A combination of the hole-transport material and the electron-transport material in the light-emitting layer forms an exciplex. The light-emitting materials of the first light-emitting layer and the third light-emitting layer are the same and have an emission peak at a shorter wavelength than that of the second light-emitting layer.

Another embodiment of the present invention is the light-emitting element in which the hole-transport materials of the first light-emitting layer, the second light-emitting layer, and the third light-emitting layer are the same and the electron-transport materials of the first light-emitting layer, the second light-emitting layer, and the third light-emitting layer are the same in each of the above structures including the hole-transport material and the electron-transport material in the light-emitting layer.

Another embodiment of the present invention is the light-emitting element in which the light-emitting material included in the light-emitting layer is a substance emitting phosphorescence in each of the above structures.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. A weight proportion of the hole-transport material to the electron-transport material in the first light-emitting layer and the third light-emitting layer is lower than or equal to 50%, and a weight proportion of the hole-transport material to the electron-transport material in the second light-emitting layer is lower than or equal to the weight proportion of the hole-transport material to the electron-transport material in the first light-emitting layer and the third light-emitting layer. Light emission obtained from the first light-emitting layer and light emission obtained from the third light-emitting layer has the same light emission color and is exhibited at a shorter wavelength than light emission obtained from the second light-emitting layer.

Another embodiment of the present invention is a light-emitting element including an EL layer including at least a light-emitting layer between a pair of electrodes. The light-emitting layer includes a light-emitting material, a hole-transport material, and an electron-transport material, and has a stacked-layer structure of a first light-emitting layer, a second light-emitting layer, and a third light-emitting layer from an anode side. A weight proportion of the hole-transport material to the electron-transport material in the first light-emitting layer and the third light-emitting layer is lower than or equal to 50%, and a weight proportion of the hole-transport material to the electron-transport material in the second light-emitting layer is lower than or equal to the weight proportion of the hole-transport material to the electron-transport material in the first light-emitting layer and the third light-emitting layer. The light-emitting materials of the first light-emitting layer and the third light-emitting layer are the same and have an emission peak at a shorter wavelength than that of the second light-emitting layer.

Another embodiment of the present invention is a light-emitting element including a plurality of EL layers between a pair of electrodes, and a charge generation layer between the adjacent EL layers. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. Light emission obtained from the first light-emitting layer and light emission obtained from the third light-emitting layer has the same light emission color and is exhibited at a shorter wavelength than light emission obtained from the second light-emitting layer.

Another embodiment of the present invention is a light-emitting element including a plurality of EL layers between a pair of electrodes, and a charge generation layer between the adjacent EL layers. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. The light-emitting materials of the first light-emitting layer and the third light-emitting layer are the same and have an emission peak at a shorter wavelength than that of the second light-emitting layer.

Another embodiment of the present invention is the light-emitting element in which at least one of the plurality of EL layers emits different color light in each of the structures including the plurality of EL layers between the pair of electrodes.

Another embodiment of the present invention is a light-emitting device that includes a light-emitting element including an EL layer between a reflective electrode and a transflective electrode. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. The light-emitting element includes at least a first light-emitting element in which light emission is obtained from the first light-emitting layer and the third light-emitting layer and a second light-emitting element in which light emission is obtained from the second light-emitting layer, and the light emission obtained from the first light-emitting element is exhibited at a shorter wavelength than light emission obtained from the second light-emitting element.

Another embodiment of the present invention is a light-emitting device that includes a light-emitting element including an EL layer between a reflective electrode and a transflective electrode. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. The light-emitting materials of the first light-emitting layer and the third light-emitting layer are the same and have an emission peak at a shorter wavelength than that of the second light-emitting layer. The light-emitting element includes at least a first light-emitting element in which light emission is obtained from the first light-emitting layer and the third light-emitting layer and a second light-emitting element in which light emission is obtained from the second light-emitting layer.

Another embodiment of the present invention is a light-emitting device that includes a light-emitting element including an EL layer between a pair of electrodes. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. Light emission obtained from the first light-emitting layer and light emission obtained from the third light-emitting layer has the same light emission color and is exhibited at a shorter wavelength than light emission obtained from the second light-emitting layer. The light-emitting element includes at least a first light-emitting element in which first light emission is obtained through a first color filter and a second light-emitting element in which second light emission is obtained through a second color filter.

Another embodiment of the present invention is a light-emitting device that includes a light-emitting element including an EL layer between a pair of electrodes. The EL layer includes at least a light-emitting layer. The light-emitting layer includes a light-emitting material, a hole-transport material, and an electron-transport material, and has a stacked-layer structure of a first light-emitting layer, a second light-emitting layer, and a third light-emitting layer from an anode side. The light-emitting materials of the first light-emitting layer and the third light-emitting layer are the same and have an emission peak at a shorter wavelength than that of the second light-emitting layer. The light-emitting element includes at least a first light-emitting element in which first light emission is obtained through a first color filter and a second light-emitting element in which second light emission is obtained through a second color filter.

Another embodiment of the present invention is a light-emitting device in which one electrode of the light-emitting element is formed by stacking a transparent conductive film over a reflective electrode, and the first light-emitting element and the second light-emitting element have different thicknesses of the transparent conductive film in each of the structures including the plurality of light-emitting elements.

Another embodiment of the present invention is a light-emitting device including the light-emitting element having any of the above-described structures.

Other embodiments of the present invention are not only a light-emitting device including the light-emitting element but also an electronic device and a lighting device each including the light-emitting device. Accordingly, a light-emitting device in this specification refers to an image display device, or a light source (including a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a light-emitting element by a chip on glass (COG) method.

One embodiment of the present invention can provide a light-emitting element with high reliability which can keep favorable characteristics after long-time driving. Another embodiment of the present invention can provide a light-emitting device having a long lifetime in which the light-emitting element is used. Another embodiment of the present invention can provide an electronic device and a lighting device each of which has a long lifetime. Another embodiment of the present invention can provide a novel light-emitting element, a novel light-emitting device, or the like. Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:

FIG. 6 illustrates lighting devices;

DETAILED DESCRIPTION OF THE INVENTION

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Embodiment 1

In this embodiment, a light-emitting element which is one embodiment of the present invention will be described.

The light-emitting element of one embodiment of the present invention is formed by providing an EL layer including a light-emitting layer between a pair of electrodes. The light-emitting layer has a stacked-layer structure of: a first light-emitting layer including at least a first light-emitting material (also referred to as a guest material), an electron-transport material (also referred to as a host material), and a hole-transport material (also referred to as an assist material); a second light-emitting layer including at least a second light-emitting material, the electron-transport material, and the hole-transport material; and a third light-emitting layer including at least the first light-emitting material, the electron-transport material, and the hole-transport material.

An element structure of the light-emitting element of one embodiment of the present invention is described below with reference to FIG. 1.

Figure 1:
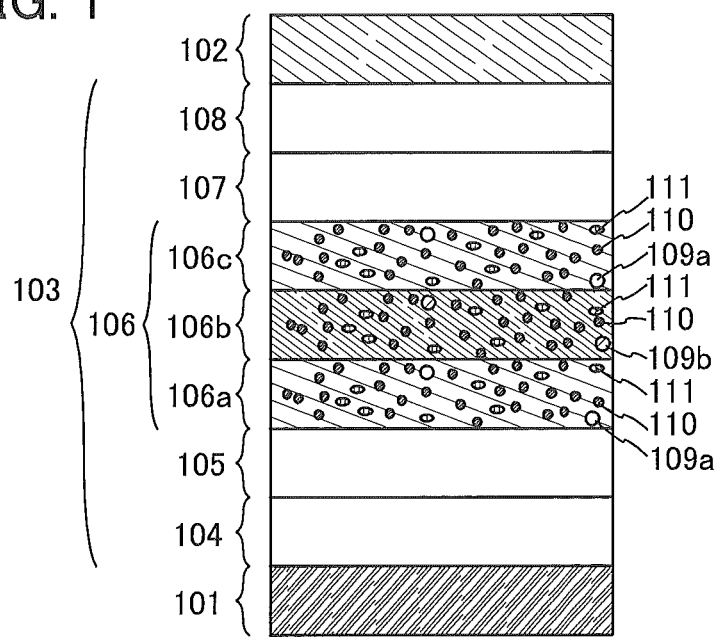
FIG. 1 illustrates a structure of a light-emitting element of one embodiment of the present invention.

In the light-emitting element illustrated in FIG. 1, an EL layer 103 including a light-emitting layer 106 is provided between a pair of electrodes (an anode 101 and a cathode 102), and the EL layer 103 has a structure in which a hole-injection layer 104, a hole-transport layer 105, the light-emitting layer 106 (106a, 106b, and 106c), an electron-transport layer 107, an electron-injection layer 108, and the like are sequentially stacked over the anode 101.

The light-emitting layer 106 has a stacked-layer structure of a plurality of light-emitting layers (106a, 106b, and 106c). As illustrated in FIG. 1, a first light-emitting layer 106a, a second light-emitting layer 106b, and a light-emitting layer 106c are sequentially stacked over the anode 101. The first light-emitting layer 106a includes at least a first light-emitting material 109a, an electron-transport material 110, and a hole-transport material 111. The second light-emitting layer 106b includes at least a second light-emitting material 109b, the electron-transport material 110, and the hole-transport material 111. The third light-emitting layer 106c includes at least the first light-emitting material 109a, the electron-transport material 110, and the hole-transport material 111.

As for the light-emitting materials (the first light-emitting material 109a and the second light-emitting material 109b) included in the light-emitting layer 106, the first light-emitting material 109a is used for the first light-emitting layer 106a and the third light-emitting layer 106c, and the second light-emitting material 109b is used for the second light-emitting layer 106b. Note that the second light-emitting material 109b has an emission peak wavelength that is longer than that of the first light-emitting material 109a.

As the electron-transport material 110 included in the light-emitting layer 106, an organic compound having an electron mobility of greater than or equal to $10^{-6}$ cm$^2$/Vs is mainly used, and as the hole-transport material 111, an organic compound having a hole mobility of greater than or equal to $10^{-6}$ cm$^2$/Vs is mainly used.

When the light-emitting layer 106 has a structure in which the light-emitting material is dispersed in the electron-transport material 110 and the hole-transport material 111, crystallization of the light-emitting layer 106 can be suppressed. Furthermore, it is possible to suppress concentration quenching due to high concentration of the light-emitting material, and thus the light-emitting element can have higher emission efficiency.

In the stacked light-emitting layers (106a, 106b, and 106c), it is preferable that the same material be used as the electron-transport materials 110 and the same material be used as the hole-transport materials 111; however, different materials can be used as long as the light-emitting layers can function as light-emitting layers.

It is preferable that the level of triplet excitation energy (T1 level) of the electron-transport material 110 (or the hole-transport material 111) be higher than the T1 levels of the light-emitting materials (109a and 109b). This is because when the T1 level of the electron-transport material 110 (or the hole-transport material 111) is lower than the T1 levels of the light-emitting materials (109a and 109b), the triplet excitation energy of the light-emitting materials (109a and 109b) contributing to light emission is quenched by the electron-transport material 110 (or the hole-transport material 111), and the emission efficiency is decreased.

In addition, it is preferable that, in any or all of the stacked light-emitting layers 106 (106a, 106b, and 106c), a combination of the electron-transport material 110 and the hole-transport material 111 forms an exciplex. This is because, in this case, the emission wavelength of the formed exciplex is on the longer wavelength side than the emission wavelength (fluorescent wavelength) of each of the electron-transport material 110 and the hole-transport material 111, and thus fluorescent spectra of the electron-transport material 110 and the hole-transport material 111 can be converted into emission spectra that are on the longer wavelength side, and the emission efficiency can be further increased.

In the light-emitting element of one embodiment of the present invention illustrated in FIG. 1, three light-emitting layers included in the EL layer are stacked, and the light-emitting layer containing the light-emitting material exhibiting emission at a long wavelength is sandwiched between the two light-emitting layers each of which contains a light-emitting material exhibiting emission at a short wavelength. With such a structure, when the light-emitting element is driven, the carrier balance in the light-emitting layer is changed over time, and when a light-emitting area is shifted to the second light-emitting layer (106b in FIG. 1) side, the third light-emitting layer (106c in FIG. 1) can emit light. Thus, when the light-emitting element is driven, degradation of the first light-emitting layer in the initial stage and an increase in luminance of the second light-emitting layer can be suppressed. That is, degradation of the characteristics of the whole light-emitting layer can be suppressed; thus, the favorable characteristics can be kept after long-time driving.

Next, a specific example in manufacturing the above light-emitting element is described.

As the first electrode (anode) 101 and the second electrode (cathode) 102, a metal, an alloy, an electrically conductive compound, a mixture thereof, and the like can be used. Specific examples are indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like, can be used. The first electrode (anode) 101 and the second electrode (cathode) 102 can be formed by, for example, a sputtering method or an evaporation method (including a vacuum evaporation method).

The hole-injection layer 104 injects holes into the light-emitting layer 106 through the hole-transport layer 105 with a high hole-transport property. The hole-injection layer 104 contains a hole-transport material and an acceptor substance, so that electrons are extracted from the hole-transport material by the acceptor substance to generate holes and the holes are injected into the light-emitting layer 106 through the hole-transport layer 105. The hole-transport layer 105 is formed using a hole-transport material.

Specific examples of the hole-transport material, which is used for the hole-injection layer 104 and the hole-transport layer 105, include aromatic amine compounds such as 4,4'-bis[N-(1-naphthyl)-N-phenylamino]biphenyl (abbreviation: NPB or a-NPD), N,N'-bis(3-methylphenyl)-N,N-diphenyl-[1,1'biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylearbazole (abbreviation: PCzPCN1). Other examples include carbazole derivatives such as 4,4'-di(N-carbazolyl) biphenyl (abbreviation: CBP), 1,3,5-tris[4-(N-carbazolyl) phenyl]benzene (abbreviation: TCPB), and 9-[4-(10-phenyl-9-anthracenyl)phenyl]-9H-carbazole (abbreviation: CzPA). The substances listed here are mainly ones that have a hole mobility of $10^{-6}$ cm$^2$/Vs or higher. Note that any substance other than the substances listed here may be used as long as the hole-transport property is higher than the electron-transport property.

A high molecular compound such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Examples of the acceptor substance that is used for the hole-injection layer 104 include transition metal oxides and oxides of metals belonging to Groups 4 to 8 of the periodic table. Specifically, molybdenum oxide is particularly preferable.

The light-emitting layer 106 (106a, 106b, and 106c) is a layer containing the light-emitting materials (109a and 109b). The light-emitting layer 106 (106a, 106b, and 106c) described in this embodiment includes the electron-transport material 110 and the hole-transport material 111 in addition to the light-emitting materials (109a and 109b).

There is no particular limitation on the material that can be used as the light-emitting materials (or emission center substance) (109a and 109b) in the light-emitting layer 106 (106a, 106b, and 106c). A light-emitting material that converts singlet excitation energy into luminescence or a light-emitting material that converts triplet excitation energy into luminescence can be used. Note that the emission color of the light-emitting material 109a has a shorter wavelength than the emission color of the light-emitting material 109b. Examples of the light-emitting material and the emission center substance are given below.

As an example of the light-emitting material that converts singlet excitation energy into luminescence, a substance that emits fluorescence can be given. Examples of the substance emitting fluorescence include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"', N""-octaphenyldibenzo[g,p]chrysene-2,7,10,15-tetraamine (abbreviation: DBC1), coumarin 30, N-(9, 10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'Y-tetrakis(4-methylphenyl)acenaphtho[1,2-a]fluoranthene-3,10-diamine (abbreviation: p-mPhAFD), {2-isopropyl-6-[2-(1,1,7,7-tetramethyl-2,3,6,7-tetrahydro-1H,5H-benzo[ij]quinolizin-9-yl) ethenyl]-4H-pyran-4-ylidene}propanedinitrile (abbreviation: DCJTI), {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij] quinolizin-9-yl)ethenyl]-4H-pyran-4-ylidene}propanedinitrile (abbreviation: BisDCJTM).

Furthermore, examples of the light-emitting material converting triplet excitation energy into luminescence include a substance emitting phosphorescence and a thermally activated delayed fluorescence (TADF) material. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Examples of the substance that emits phosphorescence include bis[2-(3',5'-bistrifluoromethylphenyl)pyridinato-N,C$^{2'}$]iridium(III) picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato) (monophenanthroline) terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N, C$^{2'}$}iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(3,5-dimethyl-2-phenylpyrazinato) iridium(III) (abbreviation: [Ir(mppr-Me)$_2$(acac)]), (acetylacetonato)bis(5-isopropyl-3-methyl-2-phenylpyrazinato) iridium(III) (abbreviation: [Ir(mppr-iPr)$_2$(acac)]), (acetylacetonato)bis(2,3,5-triphenylpyrazinato)iridium(III) (abbreviation: Ir(tppr)$_2$(acac)), bis(2,3,5-triphenylpyrazinato) (dipivaloylmethanate)iridium(III) (abbreviation: [Ir(tppr)$_2$(dpm)], (acetylacetonato)bis(6-tert-butyl-4-phenylpyrimidinato)iridium(III) (abbreviation: [Ir(tBuppm)$_2$(acac)]), (acetylacetonato)bis(4,6-diphenylpyrimidinato) iridium(III) (abbreviation: [Ir(dppm)$_2$(acac)]), 2,3,7,8,12,13, 17,18-octaethyl-21H,23H-porphyrin platinum(II) (abbreviation: PtOEP), tris(1,3-diphenyl-1,3-propanedionato) (monophenanthroline)europium(III) (abbreviation: Eu(DBM)$_3$(Phen)), tris[1-(2-thenoyl)-3,3,3-trifluoroacetonato] (monophenanthroline)europium(III) (abbreviation: Eu(TTA)$_3$(Phen)), and the like.

Examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (PIC-TRZ). Note that a material in which the π-electron rich heteroaromatic ring is directly bonded to the π-electron deficient heteroaromatic ring is particularly preferably used because both the donor property of the π-electron rich heteroaromatic ring and the acceptor property of the π-electron deficient heteroaromatic ring are increased and the energy difference between the S$_1$ level and the T$_1$ level becomes small.

As the electron-transport material 110 used in the light-emitting layer 106 (106a, 106b, and 106c), a π-electron deficient heteroaromatic compound such as a nitrogen-containing heteroaromatic compound is preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As the hole-transport material 111 used in the light-emitting layer 106 (106a, 106b, and 106c), a π-electron rich heteroaromatic compound (e.g., a carbazole derivative or an indole derivative) or an aromatic amine compound is preferable, examples of which include 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenyl-carbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9, 9-dimethyl-9H-fluoren-2-yl)-N-{9, 9-dimethyl-2-[N'-phenyl-N'-(9, 9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N-(3-methylphenyl)-N-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

The electron-transport layer 107 is a layer containing a substance with a high electron-transport property. For the electron-transport layer 107, a metal complex such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, or bis[2-(2-hydroxyphenyl)benzothiazolato]zinc (abbreviation: $Zn(BTZ)_2$) can be used. heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used. The substances listed here are mainly ones that have an electron mobility of $10^{-6}$ cm$^2$/Vs or higher. Note that any substance other than the substances listed here may be used for the electron-transport layer 107 as long as the electron-transport property is higher than the hole-transport property.

The electron-transport layer 107 is not limited to a single layer, but may be a stack of two or more layers each containing any of the substances listed above.

The electron-injection layer 108 is a layer containing a substance with a high electron-injection property. For the electron-injection layer 108, an alkali metal, an alkaline earth metal, or a compound thereof, such as lithium fluoride (LiF), cesium fluoride (CsF), calcium fluoride ($CaF_2$), or lithium oxide ($LiO_x$) can be used. A rare earth metal compound such as erbium fluoride ($ErF_3$) can also be used. An electride may also be used for the electron-injection layer 108. Examples of the electride include a substance in which electrons are added at high concentration to calcium oxide-aluminum oxide. Any of the substances for forming the electron-transport layer 107, which are given above, can be used.

A composite material in which an organic compound and an electron donor (donor) are mixed may also be used for the electron-injection layer 108. Such a composite material is excellent in an electron-injection property and an electron-transport property because electrons are generated in the organic compound by the electron donor. In this case, the organic compound is preferably a material that is excellent in transporting the generated electrons. Specifically, for example, the substances for forming the electron-transport layer 107 (e.g., a metal complex and a heteroaromatic compound), which are given above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. In addition, an alkali metal oxide and an alkaline earth metal oxide are preferable, and lithium oxide, calcium oxide, and barium oxide are given. A Lewis base such as magnesium oxide can also be used. An organic compound such as tetrathiafulvalene (abbreviation: TTF) can also be used.

Note that each of the above-described hole-injection layer 104, hole-transport layer 105, light-emitting layer 106, electron-transport layer 107, and electron-injection layer 108 can be formed by a method such as an evaporation method (e.g., a vacuum evaporation method), an ink-jet method, or a coating method.

In the above-described light-emitting element, current flows because of a potential difference generated between the first electrode 101 and the second electrode 102 and holes and electrons are recombined in the EL layer 103, whereby light is emitted. Then, the emitted light is extracted outside through one or both of the first electrode 101 and the second electrode 102. Thus, one or both of the first electrode 101 and the second electrode 102 are electrodes having light-transmitting properties.

By forming the light-emitting element having the structure described in this embodiment as described above, even when the light-emitting area is shifted due to a change in the carrier balance over driving time, another light-emitting layer can compensate for the change, and the stable state of the whole light-emitting layer can be kept. Thus, the light-emitting element can keep favorable characteristics after long-time driving.

The structure described in this embodiment can be used in appropriate combination with the structure described in any of the other embodiments.

Embodiment 2

In this embodiment, as one embodiment of the present invention, a light-emitting element (hereinafter referred to as tandem light-emitting element) in which a charge-generation layer is provided between a plurality of EL layers is described with reference to FIGS. 2A and 2B.

Figure 2A:
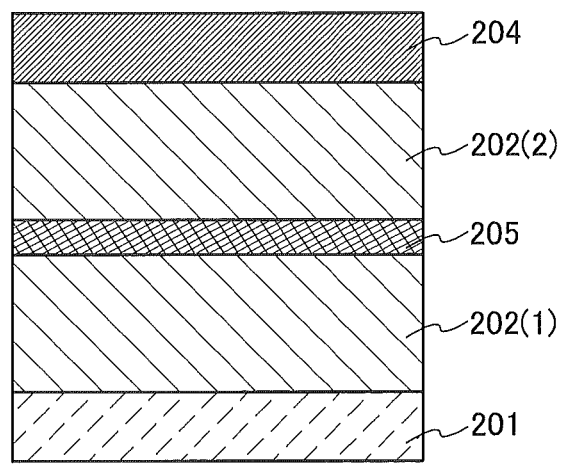
FIGS. 2A and 2B each illustrate a structure of a light-emitting element.

A light-emitting element described in this embodiment is a tandem light-emitting element including a plurality of EL layers (a first EL layer 202(1) and a second EL layer 202(2)) between a pair of electrodes (a first electrode 201 and a second electrode 204) as illustrated in FIG. 2A.

In this embodiment, the first electrode 201 functions as an anode, and the second electrode 204 functions as a cathode. Note that the first electrode 201 and the second electrode 204 can have structures similar to those described in Embodiment 1. In addition, all or any of the plurality of EL layers (the first EL layer 202(1) and the second EL layer 202(2)) may have structures similar to those described in Embodiment 1. In other words, the structures of the first EL layer 202(1) and the second EL layer 202(2) may be the same or different from each other and can be similar to those of the EL layers described in Embodiment 1.

In addition, a charge-generation layer 205 is provided between the plurality of EL layers (the first EL layer 202(1) and the second EL layer 202(2)). The charge-generation layer 205 has a function of injecting electrons into one of the EL layers and injecting holes into the other of the EL layers when voltage is applied between the first electrode 201 and the second electrode 204. In this embodiment, when voltage is applied such that the potential of the first electrode 201 is higher than that of the second electrode 204, the charge-generation layer 205 injects electrons into the first EL layer 202(1) and injects holes into the second EL layer 202(2).

Note that in terms of light extraction efficiency, the charge-generation layer 205 preferably has a property of transmitting visible light (specifically, the charge-generation layer (I) 205 has a visible light transmittance of 40% or more). The charge-generation layer 205 functions even when it has lower conductivity than the first electrode 201 or the second electrode 204.

The charge-generation layer 205 may have either a structure in which an electron acceptor (acceptor) is added to a hole-transport material or a structure in which an electron donor (donor) is added to an electron-transport material. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances listed here are mainly ones that have a hole mobility of $10^{-6}$ cm$^2$/Vs or higher. Note that any organic compound other than the compounds listed here may be used as long as the hole-transport property is higher than the electron-transport property.

As the electron acceptor, 7,7,8,8-tetracyano-2,3,5,6-tetra-fluoroquinodimethane (abbreviation: F$_4$-TCNQ), chloranil, and the like can be given. Transition metal oxides can also be given. Oxides of metals belonging to Groups 4 to 8 of the periodic table can also be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable since it is stable in the air, has a low hygroscopic property, and is easy to handle.

On the other hand, in the case of the structure in which an electron donor is added to an electron-transport material, as the electron-transport material, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Alternatively, in addition to such a metal complex, PBD, OXD-7, TAZ, Bphen, BCP, or the like can be used. The substances listed here are mainly ones that have an electron mobility of $10^{-6}$ cm$^2$/Vs or higher. Note that any organic compound other than the compounds listed here may be used as long as the electron-transport property is higher than the hole-transport property.

As the electron donor, it is possible to use an alkali metal, an alkaline earth metal, a rare earth metal, metals belonging to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

Note that forming the charge-generation layer 205 by using any of the above materials can suppress a drive voltage increase caused by the stack of the EL layers.

Figure 2B:
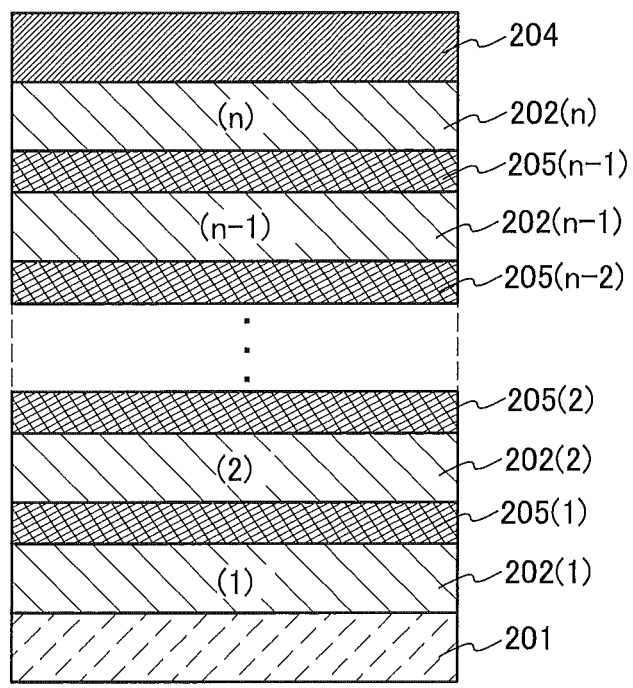

Although the light-emitting element including two EL layers is described in this embodiment, the present invention can be similarly applied to a light-emitting element in which 11 EL layers (202(1) to 202(n)) (n is three or more) are stacked as illustrated in FIG. 2B. In the case where a plurality of EL layers are included between a pair of electrodes as in the light-emitting element according to this embodiment, by providing charge-generation layers (205(1) to 205(n−1)) between the EL layers, light emission in a high luminance region can be obtained with current density kept low. Since the current density can be kept low, the element can have a long lifetime. When the light-emitting element is applied to lighting, voltage drop due to resistance of an electrode material can be reduced, which results in homogeneous light emission in a large area. In addition, a low-power-consumption light-emitting device that can be driven at low voltage can be obtained.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. Note that "complementary colors" refer to colors that can produce an achromatic color when mixed. In other words, emission of white light can be obtained by mixture of light emitted from substances whose emission colors are complementary colors.

The same can be applied to a light-emitting element having three EL layers. For example, the light-emitting element as a whole can provide white light emission when the emission color of the first EL layer is red, the emission color of the second EL layer is green, and the emission color of the third EL layer is blue.

As a light-emitting device including the above-described light-emitting element, a passive matrix light-emitting device and an active matrix light-emitting device can be fabricated. It is also possible to fabricate a light-emitting device having a microcavity structure. Each of the light-emitting devices is one embodiment of the present invention.

Note that there is no particular limitation on the structure of the transistor (FET) in the case of fabricating the active matrix light-emitting device. For example, a staggered FET or an inverted staggered FET can be used as appropriate. A driver circuit formed over a FET substrate may be formed of both an n-type FET and a p-type FET or only either an n-type FET or a p-type FET. Furthermore, there is no particular limitation on the crystallinity of a semiconductor film used for the FET. For example, either an amorphous semiconductor film or a crystalline semiconductor film can be used. Examples of a semiconductor material include Group IV semiconductors (e.g., silicon), Group III semiconductors (e.g., gallium), compound semiconductors (including oxide semiconductors), and organic semiconductors.

Note that the structure described in this embodiment can be used in appropriate combination with the structure described in any of the other embodiments.

Embodiment 3

In this embodiment, a light-emitting device which is one embodiment of the present invention will be described.

Figure 3:
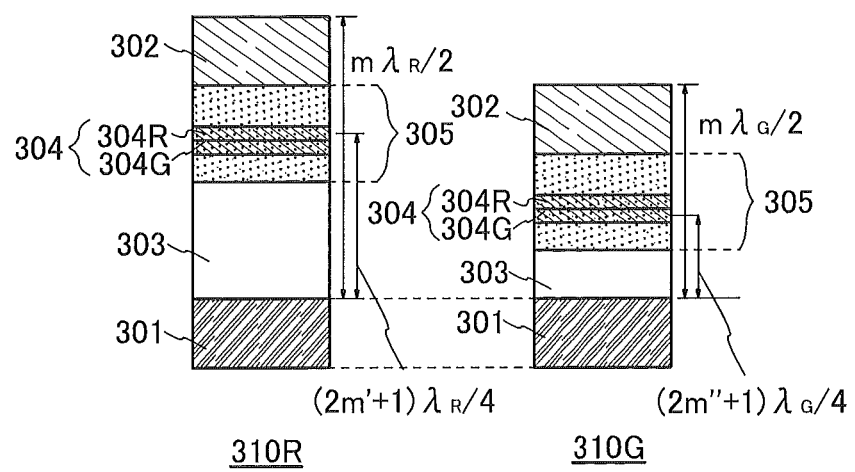
FIG. 3 illustrates structures of light-emitting elements.

A light-emitting device described in this embodiment has a micro optical resonator (microcavity) structure in which a light resonant effect between a pair of electrodes is utilized. The light-emitting device includes a plurality of light-emitting elements each of which has at least an EL layer 305 between a pair of electrodes (a reflective electrode 301 and a transflective electrode 302) as illustrated in FIG. 3. The EL layer 305 includes at least a light-emitting layer 304 serving as a light-emitting area and may further include a hole-injection layer, a hole-transport layer, an electron-transport layer, an electron-injection layer, a charge-generation layer, and the like.

In this embodiment, a light-emitting device is described which includes two kinds of light-emitting elements (a first light-emitting element 310R and a second light-emitting element 310G) as illustrated in FIG. 3.

The first light-emitting element 310R and the second light-emitting element 310G each have a structure in which a transparent conductive layer 303, the EL layer 305 partly including the light-emitting layer 304, and the transflective electrode 302 are stacked in this order over the reflective electrode 301.

The reflective electrode 301, the EL layer 305, and the transflective electrode 302 are common to the two kinds of light-emitting elements in this embodiment. The light-emitting layer 304 has a stacked-layer structure of a layer that emits light ($\lambda_G$) having a peak in a first wavelength region and a layer that emits light ($\lambda_R$) having a peak in a second wavelength region. In this case, the above wavelengths satisfy the relation of $\lambda_G < \lambda_R$.

Each of the light-emitting elements described in this embodiment has a structure in which the EL layer 305 is provided between the reflective electrode 301 and the transflective electrode 302. Light emitted in all directions from the light-emitting layers included in the EL layer 305 is resonated by the reflective electrode 301 and the transflective electrode 302 which function as a micro optical resonator (a microcavity).

Note that the reflective electrode 301 is formed using a conductive material having reflectivity, and a film whose visible light reflectivity is 40% to 100%, preferably 70% to 100%, and whose resistivity is $1 \times 10^{-2}$ Ωcm or lower is used. In addition, the transflective electrode 302 is formed using a conductive material having reflectivity and a conductive material having a light-transmitting property, and a film whose visible light reflectivity is 20% to 80%, preferably 40% to 70%, and whose resistivity is $1 \times 10^{-2}$ Ωcm or lower is used.

The transparent conductive layers 303 of the light-emitting element 310R and 310G are formed so that the thicknesses thereof are different, whereby the two kinds of light-emitting elements differ from each other in the optical distance between the reflective electrode 301 and the transflective electrode 302. Thus, light with a wavelength that is resonated between the reflective electrode 301 and the transflective electrode 302 can be intensified while light with a wavelength that is not resonated therebetween can be attenuated, so that light with wavelengths which differ depending on the light-emitting elements can be extracted.

Furthermore, in the first light-emitting element 310R, the total thickness (total optical thickness) of components from the reflective electrode 301 to the transflective electrode 302 is set to $m\lambda_R/2$ (m is a natural number), and in the second light-emitting element 310G, the total thickness of components from the reflective electrode 301 to the transflective electrode 302 is set to $m\lambda_G/2$ (m is a natural number).

In this manner, the light ($\lambda_R$) emitted from the second light-emitting layer 304R included in the EL layer 305 is mainly extracted from the first light-emitting element 310R, and the light ($\lambda_G$) emitted from the first light-emitting layer 304G included in the EL layer 305 is mainly extracted from the second light-emitting element 310G. Note that the light extracted from each of the light-emitting elements is emitted from the transflective electrode 302 side.

Furthermore, strictly speaking, the total thickness from the reflective electrode 301 to the transflective electrode 302 can be the total thickness from a reflection region in the reflective electrode 301 to a reflection region in the transflective electrode 302. However, it is difficult to precisely determine the positions of the reflection regions in the reflective electrode 301 and the transflective electrode 302; therefore, it is presumed that the above effect can be sufficiently obtained wherever the reflection regions may be set in the reflective electrode 301 and the transflective electrode 302.

Moreover, in the first light-emitting element 310R, the optical distance between the reflective electrode 301 and the second light-emitting layer 304R is adjusted to a desired thickness $((2m'+1)\lambda_R/4$, where m' is a natural number); thus, light emitted from the second light-emitting layer 304R can be amplified.

Note that strictly speaking, the optical distance between the reflective electrode 301 and the second light-emitting layer 304R can be the optical distance between a reflection region in the reflective electrode 301 and a light-emitting region in the second light-emitting layer 304R. However, it is difficult to precisely determine the positions of the reflection region in the reflective electrode 301 and the light-emitting region in the second light-emitting layer 304R; therefore, it is presumed that the above effect can be sufficiently obtained wherever the light-emitting region may be set in the second light-emitting layer 304R.

Moreover, in the second light-emitting element 310G, the optical distance between the reflective electrode 301 and the first light-emitting layer 304G is adjusted to a desired thickness ((2m"+1)$\lambda_G$/4, where m" is a natural number); thus, light emitted from the first light-emitting layer 304G can be amplified.

Note that strictly speaking, the optical distance between the reflective electrode 301 and the first light-emitting layer 304G can be the optical distance between a reflection region in the reflective electrode 301 and a light-emitting region in the first light-emitting layer 304G. However, it is difficult to precisely determine the positions of the reflection region in the reflective electrode 301 and the light-emitting region in the first light-emitting layer 304G; therefore, it is presumed that the above effect can be sufficiently obtained wherever the reflection region and the light-emitting region may be set in the reflective electrode 301 and the first light-emitting layer 304G, respectively.

The optical distance between the reflective electrode 301 and the light-emitting layer 304 is set as described above. However, in the case where the light-emitting layer has such a stacked-layer structure (specifically, the light-emitting layer includes a plurality of layers that emit light ($\lambda_G$) having a peak in the same wavelength region) as is described in Embodiment 1, the optical distance between the reflective electrode 301 and the light-emitting layer 304 corresponds to the optical distance between the reflective electrode 301 and one of the light-emitting layers that emit light ($\lambda_G$) having a peak in the same wavelength region.

Note that although each of the light-emitting elements in the above-described structure includes a plurality of light-emitting layers in the EL layer, the present invention is not limited thereto; for example, the structure of the tandem light-emitting element which is described in Embodiment 2 can be combined, in which case a plurality of EL layers and a charge generation layer interposed therebetween are provided in one light-emitting element and one or more light-emitting layers are formed in each of the EL layers.

The light-emitting device described in this embodiment has a microcavity structure, in which light with wavelengths which differ depending on the light-emitting elements can be extracted even when they include the same EL layers, so that it is not needed to form light-emitting elements for the colors of R, G, and B. Therefore, the above structure is advantageous for full color display owing to easiness in achieving higher resolution display or the like. Note that a combination with coloring layers (color filters) is also possible. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Embodiment 4

In this embodiment, a light-emitting device including a light-emitting element which is one embodiment of the present invention will be described.

The light-emitting device may be either a passive matrix type light-emitting device or an active matrix type light-emitting device. Note that any of the light-emitting elements described in the other embodiments can be used for the light-emitting device described in this embodiment.

In this embodiment, an active matrix light-emitting device is described with reference to FIGS. 4A and 4B.

Figure 4A:
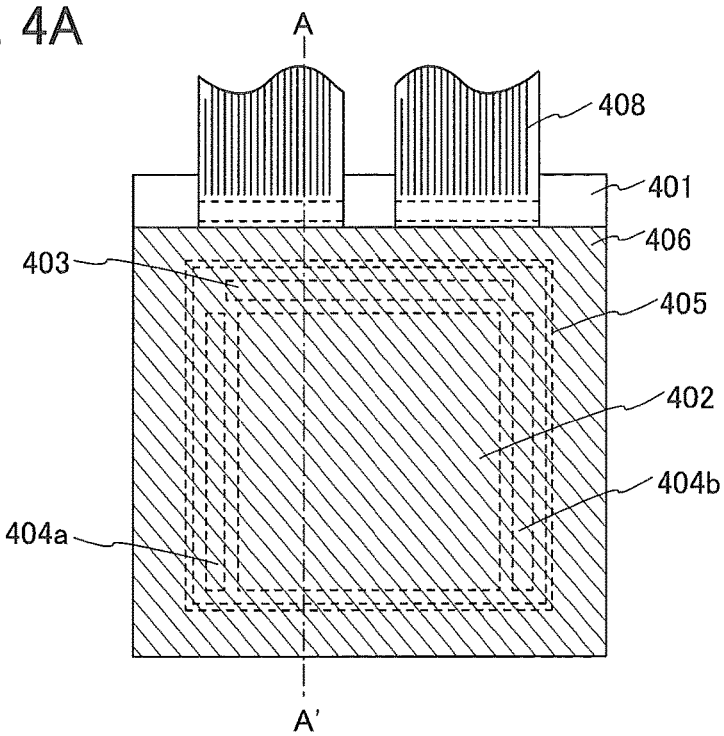
FIGS. 4A and 4B illustrate a light-emitting device.
Figure 4B:
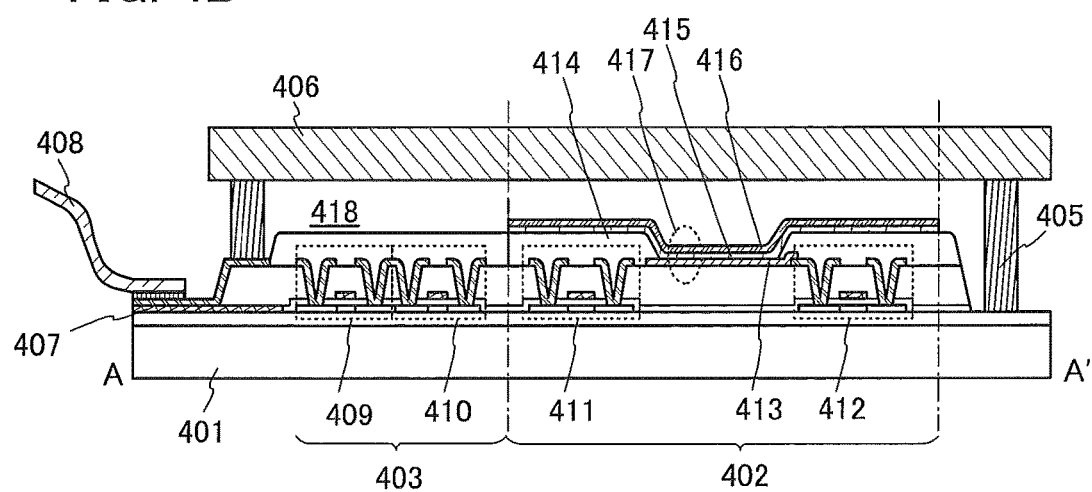

Note that FIG. 4A is a top view illustrating a light-emitting device and FIG. 4B is a cross-sectional view taken along the chain line A-A' in FIG. 4A. The active matrix light-emitting device according to this embodiment includes a pixel portion 402 provided over an element substrate 401, a driver circuit portion (a source line driver circuit) 403, and driver circuit portions (gate line driver circuits) 404a and 404b. The pixel portion 402, the driver circuit portion 403, and the driver circuit portions 404a and 404b are sealed between the element substrate 401 and a sealing substrate 406 with a sealant 405.

In addition, over the element substrate 401, a lead wiring 407 for connecting an external input terminal, through which a signal (e.g., a video signal, a clock signal, a start signal, a reset signal, or the like) or electric potential from the outside is transmitted to the driver circuit portion 403 and the driver circuit portions 404a and 404b, is provided. Here, an example is described in which a flexible printed circuit (FPC) 408 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 4B. The driver circuit portion and the pixel portion are formed over the element substrate 401; the driver circuit portion 403 that is the source line driver circuit and the pixel portion 402 are illustrated here.

The driver circuit portion 403 is an example in which an FET 409 and an FET 410 are combined. Note that each of the FET 409 and the FET 410 included in the driver circuit portion 403 may be formed with a circuit including transistors having the same conductivity type (either an n-channel transistor or a p-channel transistor) or a CMOS circuit including an n-channel transistor and a p-channel transistor. Although this embodiment shows a driver integrated type in which the driver circuit is formed over the substrate, the driver circuit is not necessarily formed over the substrate, and may be formed outside the substrate.

The pixel portion 402 includes a plurality of pixels each of which includes a switching FET 411, a current control FET 412, and a first electrode (anode) 413 that is electrically connected to a wiring (a source electrode or a drain electrode) of the current control FET 412. Although the pixel portion 402 includes two FETs, the switching FET 411 and the current control FET 412, in this embodiment, one embodiment of the present invention is not limited thereto. The pixel portion 402 may include, for example, three or more FETs and a capacitor in combination.

As the FETs 409, 410, 411, and 412, for example, a staggered transistor or an inverted staggered transistor can be used. Examples of a semiconductor material that can be used for the FETs 409, 410, 411, and 412 include Group IV semiconductors (e.g., silicon), Group III semiconductors (e.g., gallium), compound semiconductors, oxide semiconductors, and organic semiconductors. In addition, there is no particular limitation on the crystallinity of the semiconductor material, and an amorphous semiconductor or a crystalline semiconductor can be used. In particular, an oxide semiconductor is preferably used for the FETs 409, 410, 411, and 412. Examples of the oxide semiconductor include an In—Ga oxide and an In-M-Zn oxide (M is Al, Ga, Y, Zr, La, Ce, or Nd). For example, an oxide semiconductor material that has an energy gap of 2 eV or more, preferably 2.5 eV or more, further preferably 3 eV or more is used for the FETs 409, 410, 411, and 412, so that the off-state current of the transistors can be reduced.

In addition, an insulator 414 is formed to cover end portions of the first electrode (anode) 413. In this embodiment, the insulator 414 is formed using a positive photosensitive acrylic resin. The first electrode 413 is used as an anode in this embodiment.

The insulator 414 preferably has a curved surface with curvature at an upper end portion or a lower end portion thereof. This enables the coverage with a film to be formed over the insulator 414 to be favorable. The insulator 414 can be formed using, for example, either a negative photosensitive resin or a positive photosensitive resin.

The material of the insulator 414 is not limited to an organic compound and an inorganic compound such as silicon oxide, silicon oxynitride, or silicon nitride can also be used.

An EL layer 415 and a second electrode (cathode) 416 are stacked over the first electrode (anode) 413. In the EL layer 415, at least a light-emitting layer is provided, and the light-emitting layer has the stacked structure described in Embodiment 1. In addition to the light-emitting layer, a hole-injection layer, a hole-transport layer, an electron-transport layer, an electron-injection layer, a charge-generation layer, and the like can be provided as appropriate in the EL layer 415.

A light-emitting element 417 is formed of a stack of the first electrode (anode) 413, the EL layer 415, and the second electrode (cathode) 416. For the first electrode (anode) 413, the EL layer 415, and the second electrode (cathode) 416, any of the materials given in Embodiment 1 can be used. Although not illustrated, the second electrode (cathode) 416 is electrically connected to the FPC 408 which is an external input terminal.

Although the cross-sectional view of FIG. 4B illustrates only one light-emitting element 417, a plurality of light-emitting elements are arranged in matrix in the pixel portion 402. Light-emitting elements that emit light of three kinds of colors (R, G, and B) are selectively formed in the pixel portion 402, whereby a light-emitting device capable of full color display can be obtained. In addition to the light-emitting elements that emit light of three kinds of colors (R, G, and B), for example, light-emitting elements that emit light of white (W), yellow (Y), magenta (M), cyan (C), and the like may be formed. For example, the light-emitting elements that emit light of a plurality of kinds of colors are used in combination with the light-emitting elements that emit light of three kinds of colors (R, G, and B), whereby effects such as an improvement in color purity and a reduction in power consumption can be obtained. Alternatively, a light-emitting device that is capable of full color display may be fabricated by combination with color filters.

Furthermore, the sealing substrate 406 is attached to the element substrate 401 with the sealant 405, whereby a light-emitting element 417 is provided in a space 418 surrounded by the element substrate 401, the sealing substrate 406, and the sealant 405. Note that the space 418 may be filled with an inert gas (such as nitrogen and argon) or the sealant 405.

An epoxy-based resin or glass fit is preferably used for the sealant 405. The material preferably allows as little moisture and oxygen as possible to penetrate. As the sealing substrate 406, a glass substrate, a quartz substrate, or a plastic substrate formed of fiber-reinforced plastic (FRP), polyvinyl fluoride) (PVF), polyester, acrylic, or the like can be used. In the case where glass frit is used as the sealant, the element substrate 401 and the sealing substrate 406 are preferably glass substrates for high adhesion As described above, an active matrix light-emitting device can be obtained.

Note that the structure described in this embodiment can be used in appropriate combination with the structure described in any of the other embodiments.

Embodiment 5

In this embodiment, examples of a variety of electronic devices which are completed using a light-emitting device are described with reference to FIGS. 5A to 5D. The light-emitting device is fabricated using the light-emitting element of one embodiment of the present invention.

Examples of electronic appliances including the light-emitting device include television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, and large game machines such as pachinko machines. Specific examples of the electronic appliances are illustrated in FIGS. 5A to 5D.

Figure 5A:
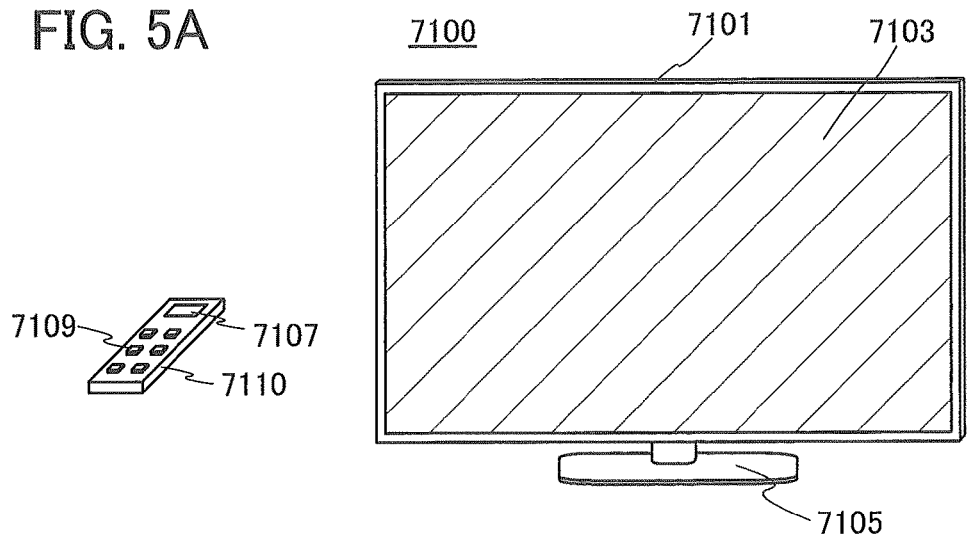
FIGS. 5A to 5D illustrate electronic devices.

FIG. 5A illustrates an example of a television device. In the television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 5B:
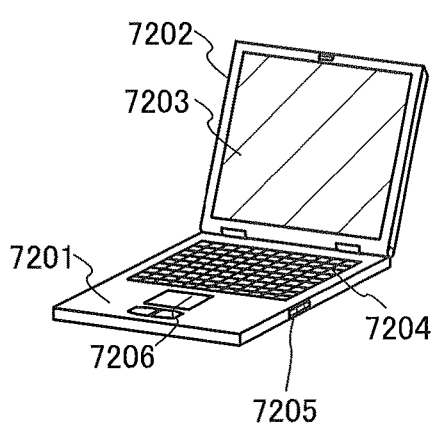

FIG. 5B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

Figure 5C:
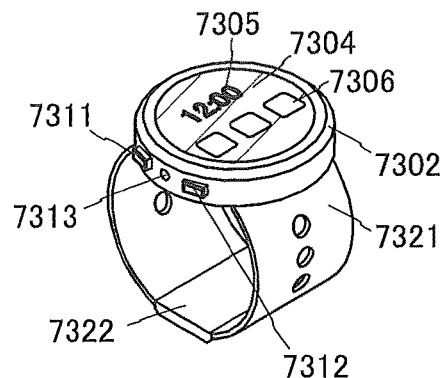

FIG. 5C illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch illustrated in FIG. 5C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 5D:
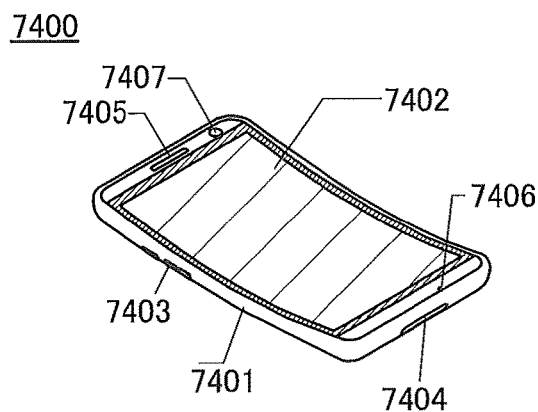

FIG. 5D illustrates an example of a mobile phone. A mobile phone 7400 includes a housing 7401 provided with a display portion 7402, a microphone 7406, a speaker 7405, a camera 7407, an external connection portion 7404, an operation button 7403, and the like. In the case where the light-emitting element of one embodiment of the present invention is formed over a flexible substrate, the light-emitting element can be used for the display portion 7402 having a curved surface as illustrated in FIG. 5D.

When the display portion 7402 of the mobile phone 7400 illustrated in FIG. 5D is touched with a finger or the like, data can be input to the mobile phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, when a backlight or a sensing light source that emits near-infrared light is provided in the display portion, an image of a finger vein, a palm vein, or the like can be taken.

As described above, the electronic appliances can be obtained using the light-emitting device that includes the light-emitting element of one embodiment of the present invention. Note that the light-emitting device can be used for electronic appliances in a variety of fields without being limited to the electronic appliances described in this embodiment.

Note that the structure described in this embodiment can be used in appropriate combination with the structure described in any of the other embodiments.

Embodiment 6

In this embodiment, examples of lighting devices which are completed using a light-emitting device are described with reference to FIG. 6. The light-emitting device is fabricated using a light-emitting element of one embodiment of the present invention.

FIG. 6 illustrates an example in which the light-emitting device is used as an indoor lighting device 8001. Since the light-emitting device can have a large area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a table by being used as a surface of a table, a lighting device 8004 that has a function as a table can be obtained. When the light-emitting device is used as part of other furniture, a lighting device that functions as the furniture can be obtained.

As described above, a variety of lighting devices that include the light-emitting device can be obtained. Note that these lighting devices are also embodiments of the present invention.

Note that the structure described in this embodiment can be used in appropriate combination with the structure described in any of the other embodiments.

Example 1

In this example, Light-emitting Element 1 of one embodiment of the present invention and Comparative Light-emitting Element 2 were fabricated. The element structures of Light-emitting Element 1 and Comparative Light-emitting Element 2 are described in detail with reference to FIG. 7A and FIG. 7B, respectively. Note that the common reference numerals are collectively described. Chemical formulae of materials used in this example are shown below.

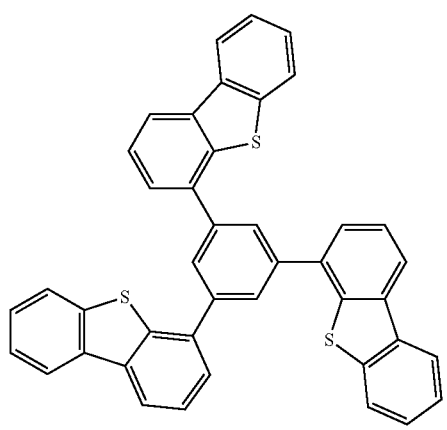
DBT3P-II
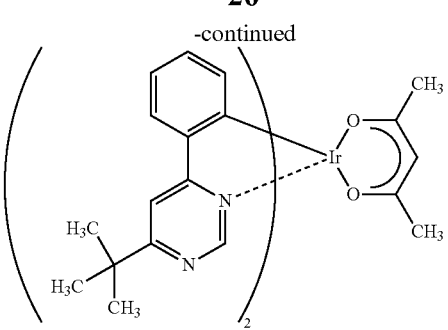
[Ir(tBuppm)₂(acac)]
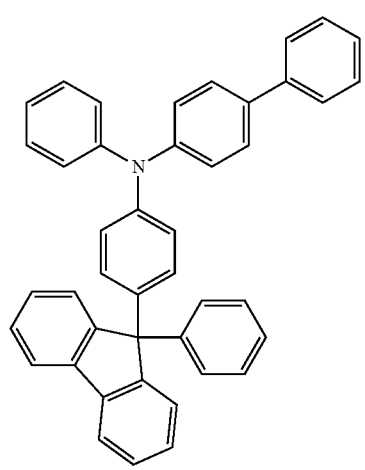
BPAFLP
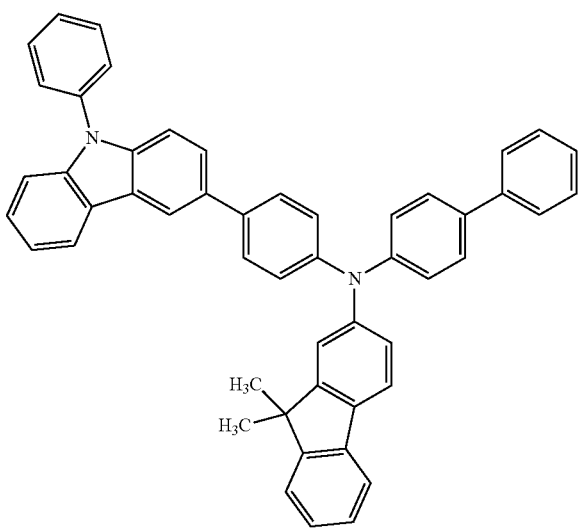
PCBBiF
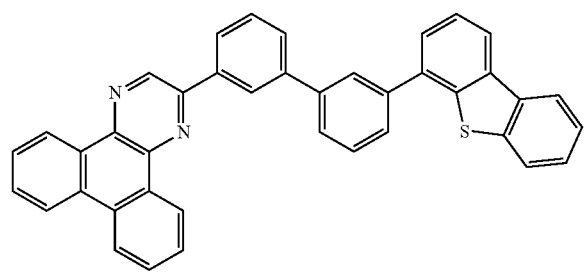
2mDBTBPDBq-II
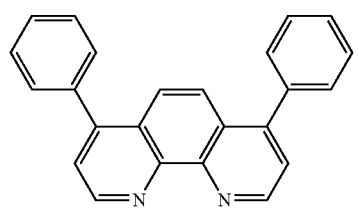
BPhen
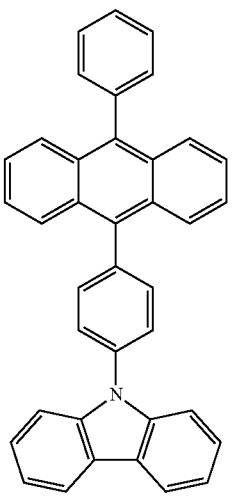
CzPA

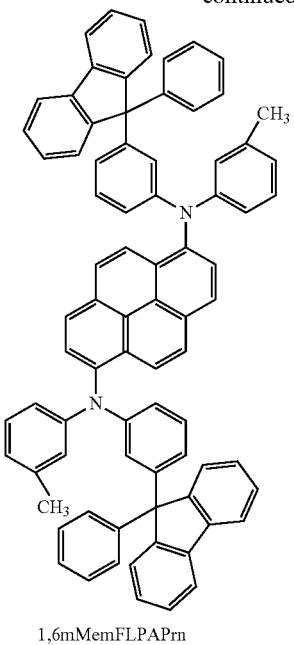

1,6mMemFLPAPrn

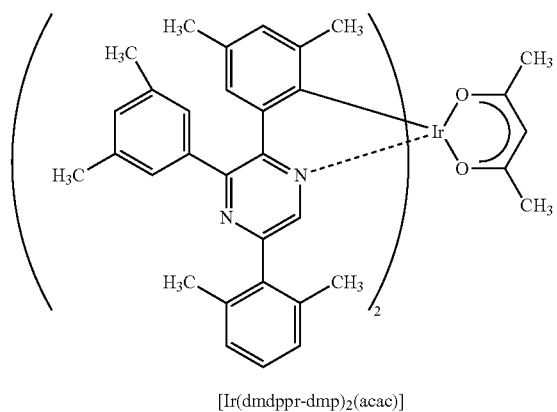

[Ir(dmdppr-dmp)₂(acac)]

<<Fabrication of Light-Emitting Element 1 and Comparative Light-Emitting Element 2>>

First, indium tin oxide containing silicon oxide (ITSO) was deposited over a glass substrate 700 by a sputtering method, so that a first electrode 701, which functions as an anode, was formed. The thickness was 110 nm and the electrode area was 2 mm×2 mm.

Then, as pretreatment for forming Light-emitting Element 1 and Comparative Light-emitting Element 2 over the substrate 700, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 700 was cooled down for about 30 minutes.

Next, the substrate 700 was fixed to a holder provided in the vacuum evaporation apparatus so that a surface of the substrate 700 over which the first electrode 701 was formed faced downward. In this example, a case will be described in which a hole-injection layer 704, a hole-transport layer 705, a light-emitting layer 706, an electron-transport layer 707, and an electron-injection layer 708, which are included in an EL layer 703, are sequentially formed by a vacuum evaporation method.

After reducing the pressure in the vacuum evaporation apparatus to $10^{-4}$ Pa, 1,3,5-tri(dibenzothiophen-4-yl)-benzene (abbreviation: DBT3P-II) and molybdenum oxide were co-evaporated at a mass ratio of 1:0.5 (DBT3P-II (abbreviation):molybdenum oxide), whereby the hole-injection layer 704 was formed over the first electrode 701. The thickness of the hole-injection layer 704 was 33 nm. Note that the co-evaporation is an evaporation method in which some different substances are evaporated from some different evaporation sources at the same time.

Then, 4-phenyl-4'-(9-phenylfluoren-9-yl)triphenylamine (abbreviation: BPAFLP) was deposited by evaporation to a thickness of 20 nm, so that the hole-transport layer 705 was formed.

Next, the light-emitting layer 706 was formed over the hole-transport layer 705.

Figure 7A:
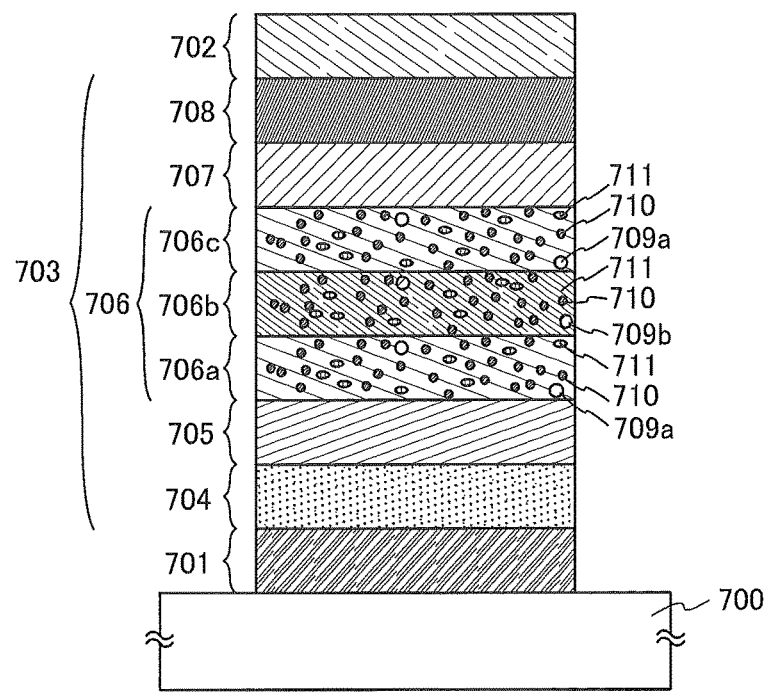
FIGS. 7A and 7B illustrate structures of Light-emitting Element 1 and Comparative Light-emitting Element 2.

In the case of Light-emitting Element 1, the light-emitting layer 706 has a stacked-layer structure of three layers of a first light-emitting layer 706*a*, a second light-emitting layer 706*b*, and a third light-emitting layer 706*c* as illustrated in FIG. 7A.

The first light-emitting layer 706*a* was formed to have a thickness of 20 nm by co-evaporating 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and (Acetylacetonato)bis(6-tert-butyl-4-phenylpyrimidinato)iridium(III) (abbreviation: [Ir(tBuppm)₂(acac)]) at a mass ratio of 0.8:0.2:0.06 (2mDBTBPDBq-II:PCBBiF:[Ir(tBuppm)₂(acac)]).

The second light-emitting layer 706*b* was formed to have a thickness of 10 nm by co-evaporating 2mDBTBPDBq-II (abbreviation), PCBBiF (abbreviation), and bis{4, 6-dimethyl-2-[5-(2,6-dimethylphenyl)-3-(3,5-dimethylphenyl)-2-pyrazinyl-κN]phenyl-κC}(2,4-pentanedionato-κ²O,O') iridium(III) (abbreviation: [Ir(dmdppr-dmp)₂(acac)]) at a mass ratio of 0.9:0.1:0.06 (2mDBTBPDBq-II:PCBBiF:[Ir(dmdppr-dmp)₂(acac)]).

The third light-emitting layer 706*c* was formed to have a thickness of 10 nm by co-evaporating 2mDBTBPDBq-II (abbreviation), PCBBiF (abbreviation), and [Ir(tBuppm)₂(acac)] (abbreviation) at a mass ratio of 0.8:0.2:0.06 (2mDBTBPDBq-II:PCBBiF:[Ir(tBuppm)₂(acac)]).

Figure 7B:
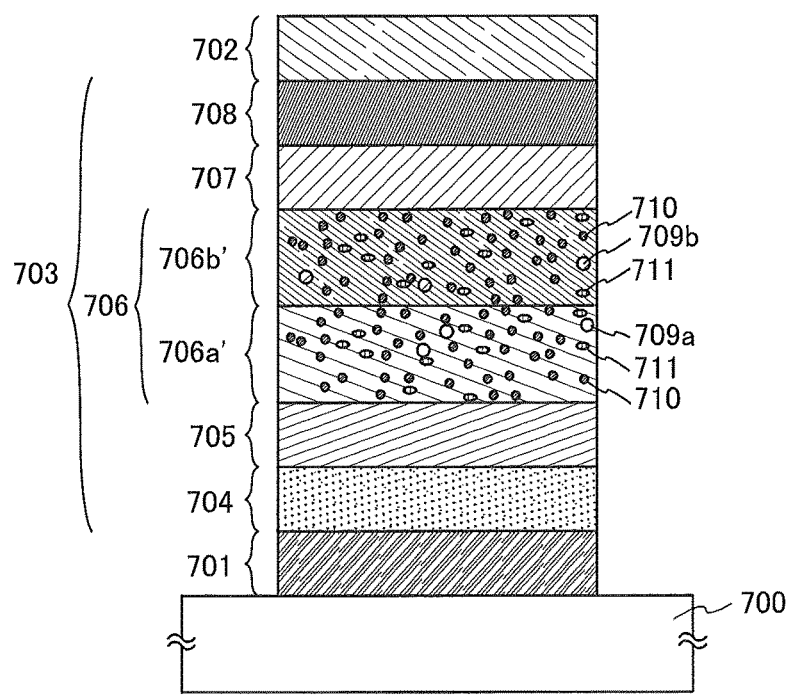

In the case of Comparative Light-emitting Element 2, the light-emitting layer 706 has a stacked-layer structure of two layers of a first light-emitting layer 706*a'* and a second light-emitting layer 706*b'* as illustrated in FIG. 7B.

The first light-emitting layer 706*a'* was formed to have a thickness of 20 nm by co-evaporating 2mDBTBPDBq-II (abbreviation), PCBBiF (abbreviation), and [Ir(tBuppm)₂(acac)] (abbreviation) at a mass ratio of 0.8:0.2:0.06 (2mDBTBPDBq-II:PCBBiF:[Ir(tBuppm)₂(acac)]).

The second light-emitting layer 706*b'* was formed to have a thickness of 20 nm by co-evaporating 2mDBTBPDBq-II (abbreviation) and [Ir(dmdppr-dmp)₂(acac)] (abbreviation) at a mass ratio of 1:0.06 (2mDBTBPDBq-II:[Ir(dmdppr-dmp)₂(acac)]).

Next, the electron-transport layer 707 was formed over the light-emitting layer 706.

In the case of Light-emitting Element 1, 2mDBTBPDBq-II (abbreviation) was deposited by evaporation to a thickness of 30 nm and then bathophenanthroline (abbreviation: Bphen) was deposited by evaporation to a thickness of 15 nm, whereby the electron-transport layer 707 was formed.

In the case of Comparative Light-emitting Element 2, 2mDBTBPDBq-II (abbreviation) was deposited by evaporation to a thickness of 35 nm and then bathophenanthroline (abbreviation: Bphen) was deposited by evaporation to a thickness of 15 nm, whereby the electron-transport layer 707 was formed.

Next, lithium fluoride was deposited by evaporation to a thickness of 1 nm, whereby the electron-injection layer 708 was formed over the electron-transport layer 707.

Finally, aluminum was deposited by evaporation to a thickness of 200 nm over the electron-injection layer 708 to form a second electrode 702 serving as a cathode; thus, Light-emitting Element 1 and Comparative Light-emitting Element 2 were obtained. Note that in all the above evaporation steps, evaporation was performed by a resistance-heating method.

Element structures of Light-emitting Element 1 and Comparative Light-emitting Element 2 obtained as described above are shown in Table 1.

that the measurement was carried out at room temperature (under an atmosphere in which the temperature was kept at 25° C.).

Figure 8:
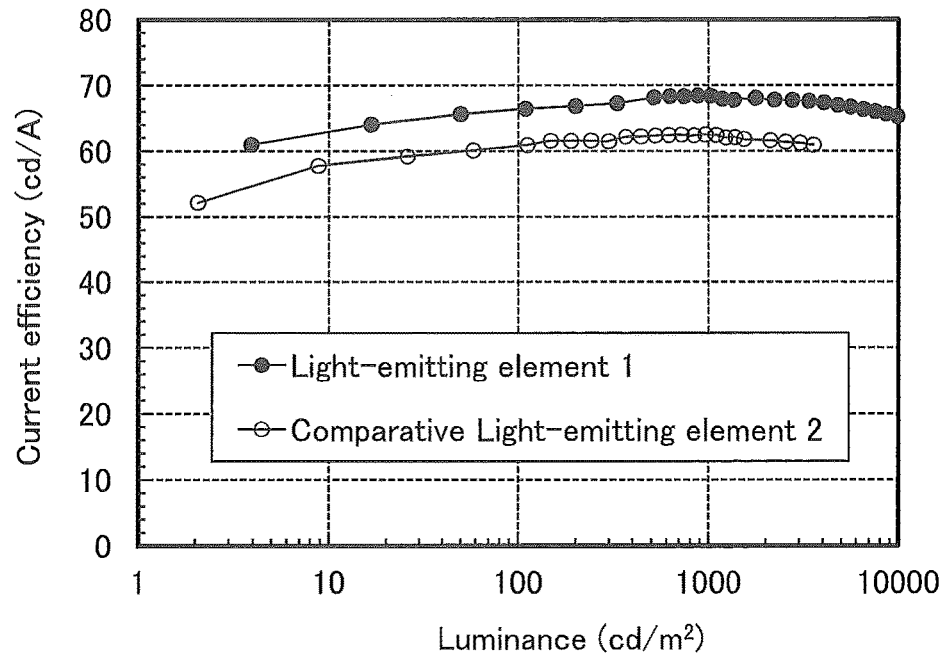
FIG. 8 shows luminance-current efficiency characteristics of Light-emitting Element 1 and Comparative Light-emitting Element 2.
Figure 9:
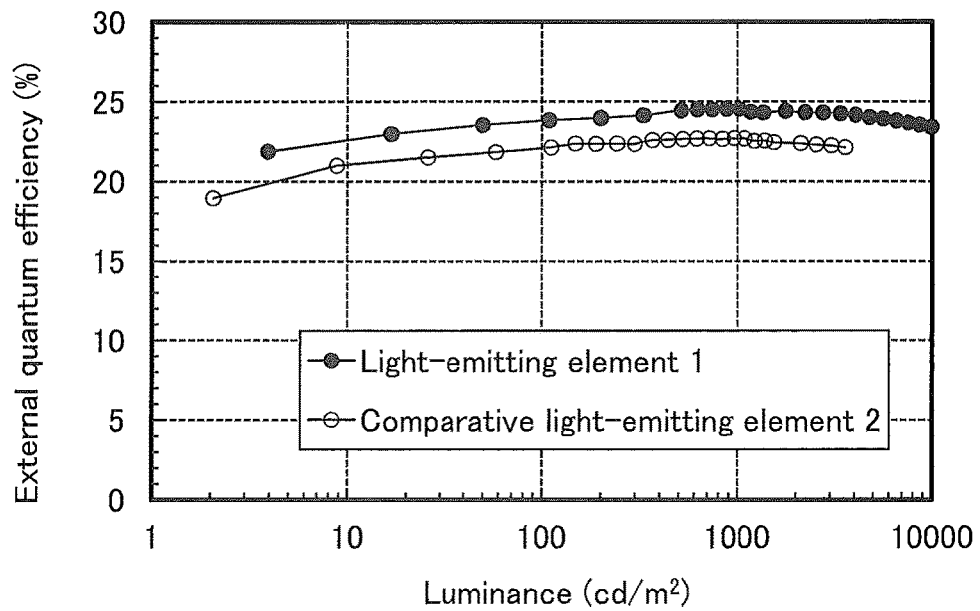
FIG. 9 shows luminance-external quantum efficiency characteristics of Light-emitting Element 1 and Comparative Light-emitting Element 2.
Figure 10:
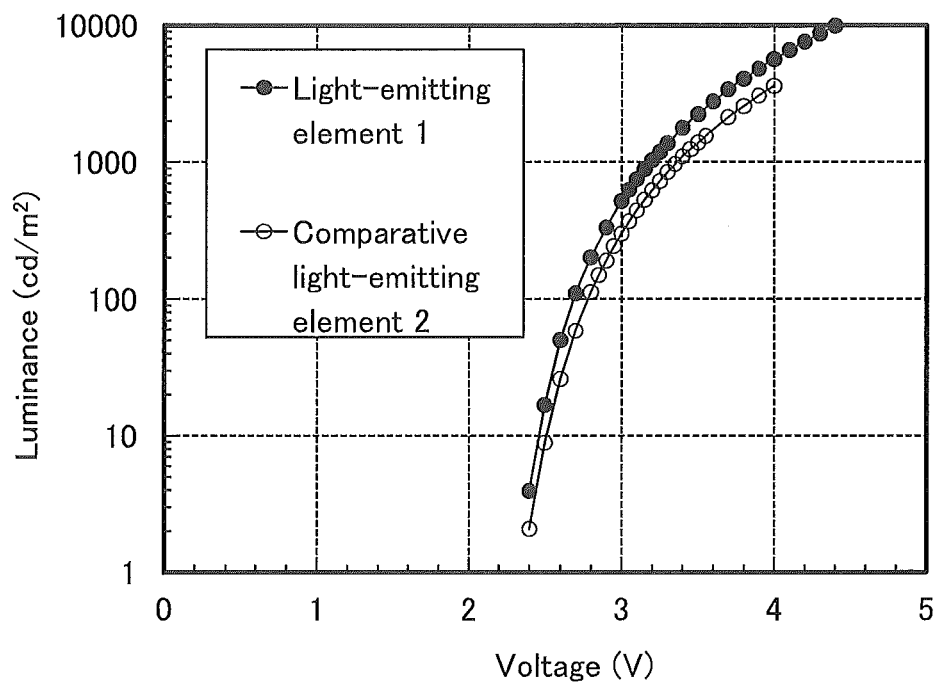
FIG. 10 shows voltage-luminance characteristics of Light-emitting Element 1 and Comparative Light-emitting Element 2.

FIG. 8 shows luminance-current efficiency characteristics of Light-emitting Element 1 and Comparative Light-emitting Element 2. In FIG. 8, the vertical axis represents current efficiency (cd/A) and the horizontal axis represents luminance (cd/m$^2$). Furthermore, FIG. 9 shows luminance-external quantum efficiency characteristics of Light-emitting Element 1 and Comparative Light-emitting Element 2. In FIG. 9, the vertical axis represents external quantum efficiency (%) and the horizontal axis represents luminance (cd/m$^2$). In addition, FIG. 10 shows voltage-luminance characteristics of Light-emitting Element 1 and Comparative Light-emitting Element 2. In FIG. 10, the vertical axis

TABLE 1

| | First electrode | Hole-injection layer | Hole-transport layer | Light-emitting layer | Electron-transport layer | Electron-injection layer | Second electrode |
|---|---|---|---|---|---|---|---|
| Light-emitting Element 1 | ITSO (110 nm) | DBT3P-II:MoOx (1:0.5 33 nm) | BPAFLP (20 nm) | * ** *** | 2mDBTBPDBq-II (30 nm) | Bphen (15 nm) | LiF (1 nm) |
| Comparative Light-emitting Element 2 | | | | * **** | 2mDBTBPDBq-II (35 nm) | | |

Second electrode column: Al (200 nm) for both.

* 2mDBTBPDBq-II:PCBBiF:[Ir(tBuppm)$_2$(acac)] (0.8:0.2:0.06 20 nm)
** 2mDBTBPDBq-II:PCBBiF:[Ir(dmdppr-dmp)$_2$(acac)] (0.9:0.1:0.06 10 nm)
*** 2mDBTBPDBq-II:PCBBiF:[Ir(tBuppm)$_2$(acac)] (0.8:0.2:0.06 10 nm)
**** 2mDBTBPDBq-II:[Ir(dmdppr-dmp)$_2$(acac)] (1:0.06 20 nm)

Furthermore, each of the fabricated Light-emitting Element 1 and Comparative Light-emitting Element 2 was sealed in a glove box containing a nitrogen atmosphere so as not to be exposed to the air (specifically, a sealant was applied onto an outer edge of the element, and the sealant was irradiated with ultraviolet light with a wavelength of 365 nm at 6 J/cm$^2$ and heat treatment was performed at 80° C. for 1 hour at the time of sealing).

<<Operation Characteristics of Light-Emitting Element 1 and Comparative Light-Emitting Element 2>>

Operation characteristics of Light-emitting Element 1 and Comparative Light-emitting Element 2 were measured. Note represents luminance (cd/m$^2$) and the horizontal axis represents voltage (V).

Table 2 shows initial values of main characteristics of Light-emitting Element 1 and Comparative Light-emitting Element 2 at a luminance of approximately 1000 cd/m$^2$.

TABLE 2

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting Element 1 | 3.2 | 0.06 | 1.5 | (0.49, 0.51) | 1000 | 68 | 67 | 25 |
| Comparative Light-emitting Element 2 | 3.4 | 0.062 | 1.5 | (0.48, 0.51) | 970 | 62 | 59 | 23 |

From the above results, it is found that Light-emitting Element 1 and Comparative Light-emitting Element 2, which were fabricated in this example, both have high external quantum efficiency; however, Light-emitting Element 1 having the element structure of one embodiment of the present invention has higher current efficiency than Comparative Light-emitting Element 2.

Figure 11:
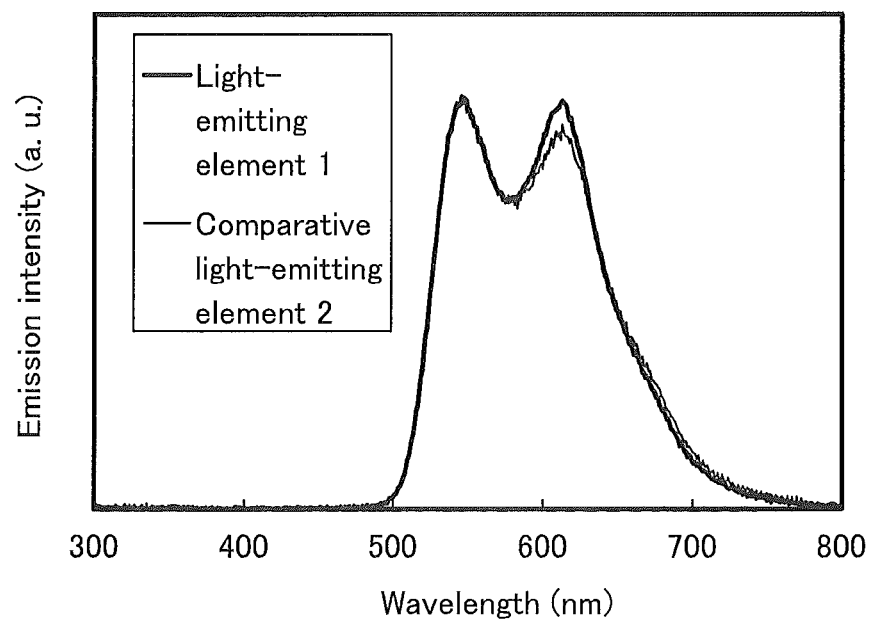
FIG. 11 shows emission spectra of Light-emitting Element 1 and Comparative Light-emitting Element 2.

FIG. 11 shows emission spectra in the initial stage of driving when a current with a current density of 2.5 mA/cm$^2$ was supplied to Light-emitting Element 1 and Comparative Light-emitting Element 2. As shown in FIG. 11, the emission spectra of Light-emitting Element 1 and Comparative Light-emitting Element 2 both have peaks at approximately 548 nm and approximately 615 nm, which indicates that the peaks are attributed to light emission from [Ir(dmdppr-dmp)$_2$ (acac)] and [Ir(tBuppm)$_2$(acac)], which are phosphorescent organometallic iridium complexes. However, it is also found that the peak at approximately 615 nm in the initial stage of driving of Comparative Light-emitting Element 2 is weaker than that of Light-emitting Element 1.

Figure 12:
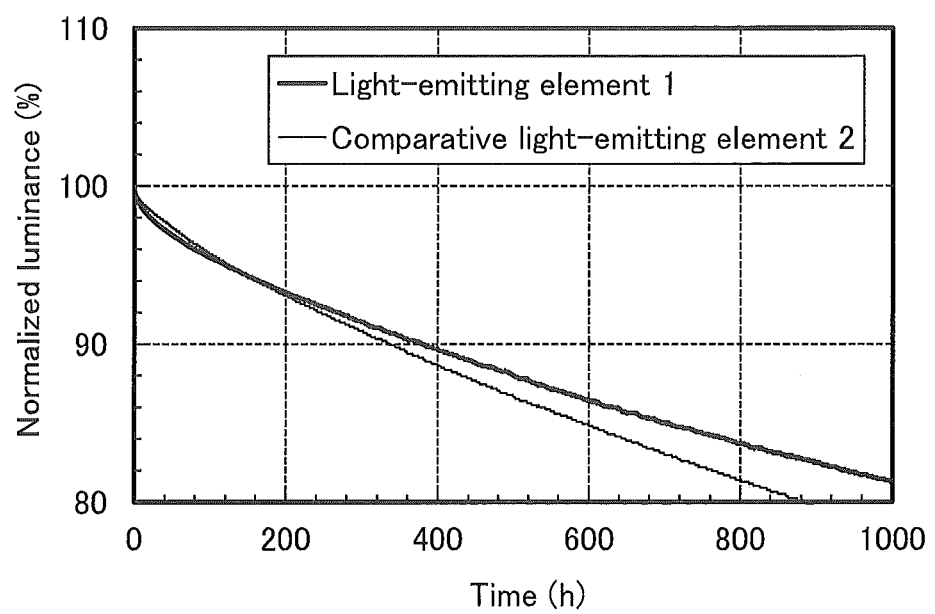
FIG. 12 shows reliability of Light-emitting Element 1 and Comparative Light-emitting Element 2.

FIG. 12 shows results of reliability tests of Light-emitting Element 1 and Comparative Light-emitting Element 2. In FIG. 12, the vertical axis represents normalized luminance (%) when an initial luminance is 100% and the horizontal axis represents driving time (h) of the element. Note that in the reliability tests, Light-emitting Element 1 and Comparative Light-emitting Element 2 were driven under the conditions where the initial luminance was set to 5000 cd/m$^2$ and the current density was constant. As a result, it is found that Light-emitting Element 1 has a longer lifetime than Comparative Light-emitting Element 2.

Figure 13A:
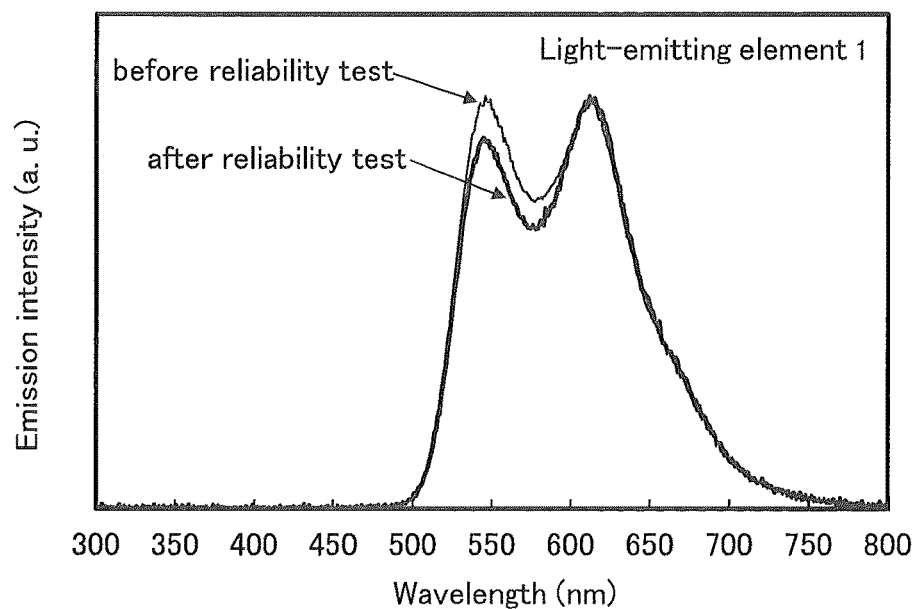
FIGS. 13A and 13B show changes in emission spectra of Light-emitting Element 1 and Comparative Light-emitting Element 2.
Figure 13B:
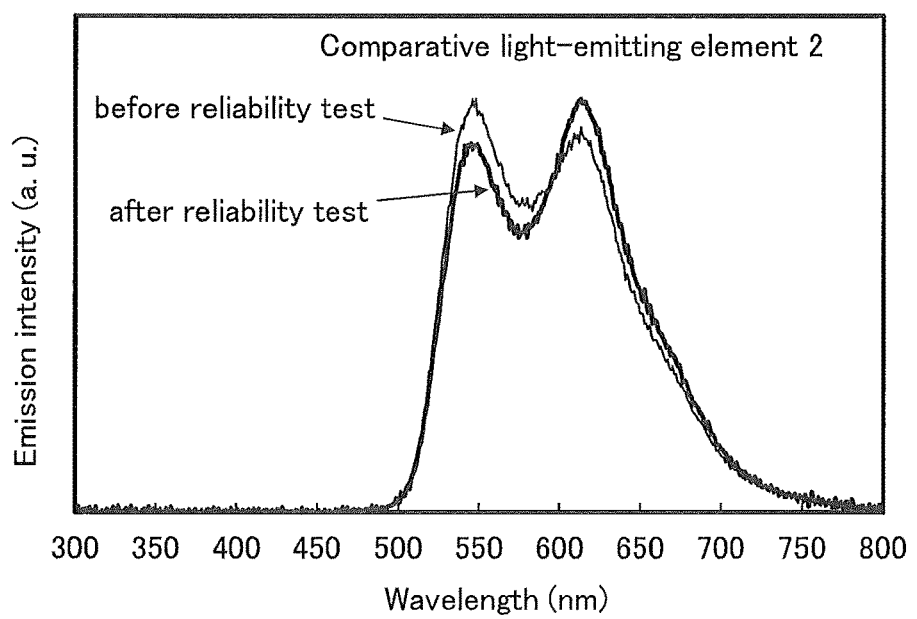

Furthermore, changes in emission spectra by the above reliability tests were measured. FIG. 13A and FIG. 13B show a measurement result of Light-emitting Element 1 and a measurement result of Comparative Light-emitting Element 2, respectively. Note that a result before the reliability test is obtained by performing measurement at the time of starting the reliability test, and a result after the reliability test is obtained by performing measurement after the reliability test for 1000 hours under the conditions where the initial luminance was set to 5000 cd/m$^2$ and the current density was constant.

From the results of FIGS. 13A and 13B, it is found that in Light-emitting Element 1, the amount of change in the whole emission spectrum before and after the reliability test, which is the sum of a decrease in the peak at approximately 548 nm and an increase in the peak at approximately 615 nm, is smaller than that in Comparative Light-emitting Element 2. This indicates that in Light-emitting Element 1 having the element structure of one embodiment of the present invention, the peak intensity of light emission is not easily changed even after long-time driving.

Note that the combination of 2mDBTBPDBq-II (abbreviation) and PCBBiF (abbreviation), which are used for the light-emitting layer in this example, forms an exciplex.

Example 2

In this example, as light-emitting elements of one embodiment of the present invention and comparative light-emitting elements, Light-emitting Element 3, Comparative Light-emitting Element 4, Light-emitting Element 5, and Comparative Light-emitting Element 6 were fabricated. Note that the details are described with reference to FIGS. 14A and 14B. A light-emitting element in this example has a combination structure of the tandem type structure described in Embodiment 2 and the microcavity structure described in Embodiment 3. Chemical formulae of materials used in this example are shown below.

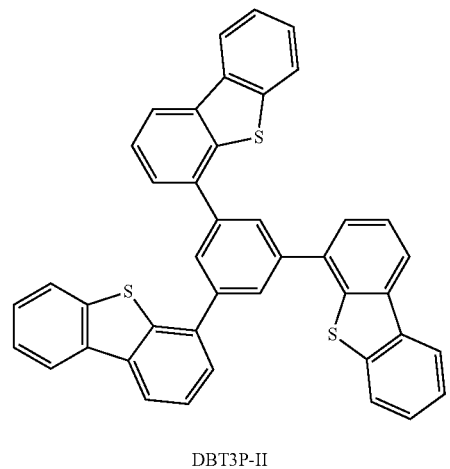

DBT3P-II

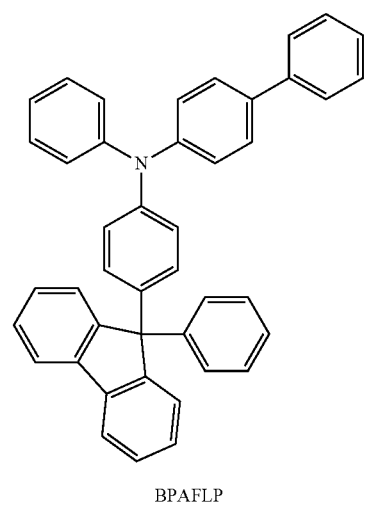

BPAFLP

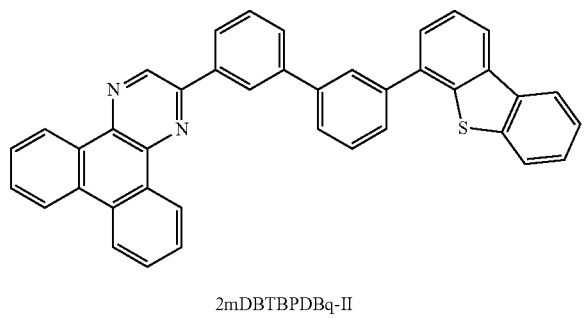

2mDBTBPDBq-II

-continued
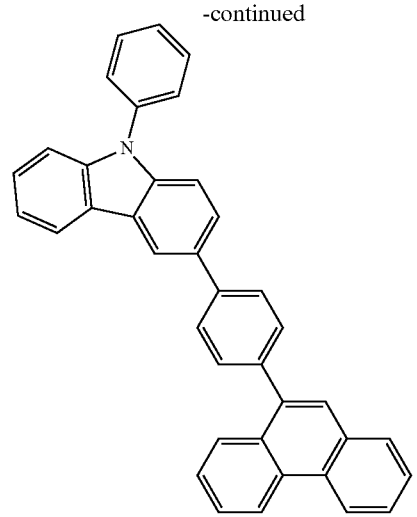
PCPPn
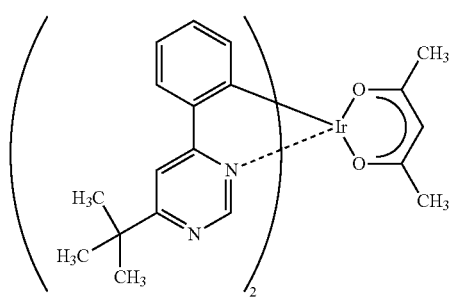
[Ir(tBuppm)₂(acac)]
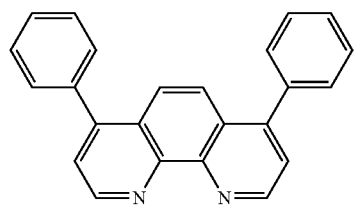
BPhen
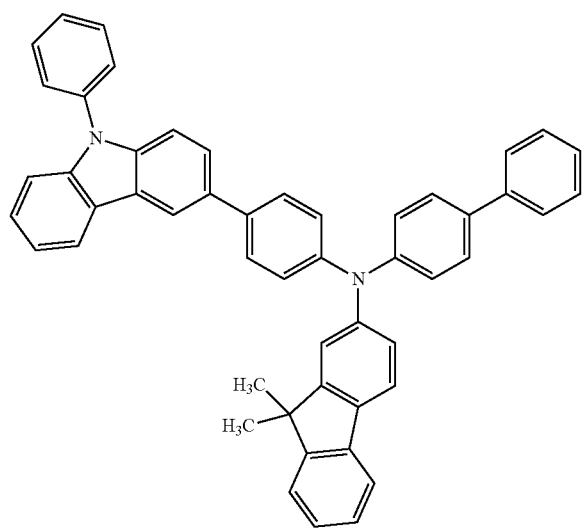
PCBBiF
-continued
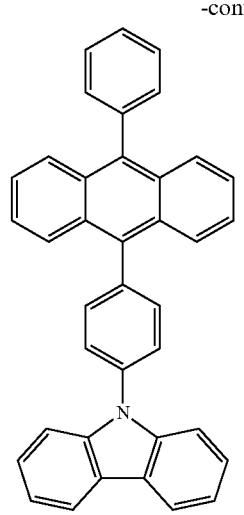
CzPA
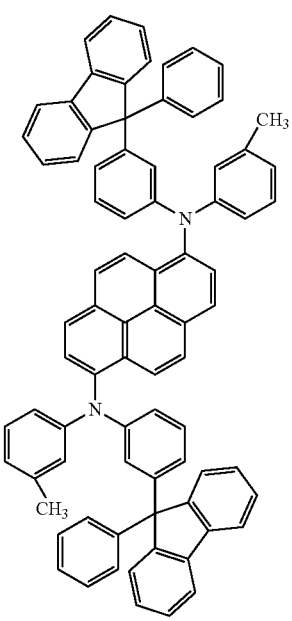
1,6mMemFLPAPrn
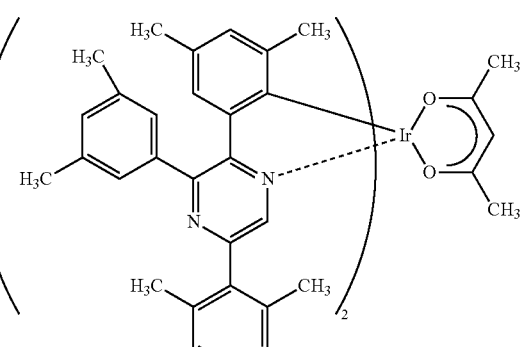
[Ir(dmdppr-dmp)₂(acac)]

<<Fabrication of Light-Emitting Element 3, Comparative Light-Emitting Element 4, Light-Emitting Element 5, and Comparative Light-Emitting Element 6>>

Figure 14A:
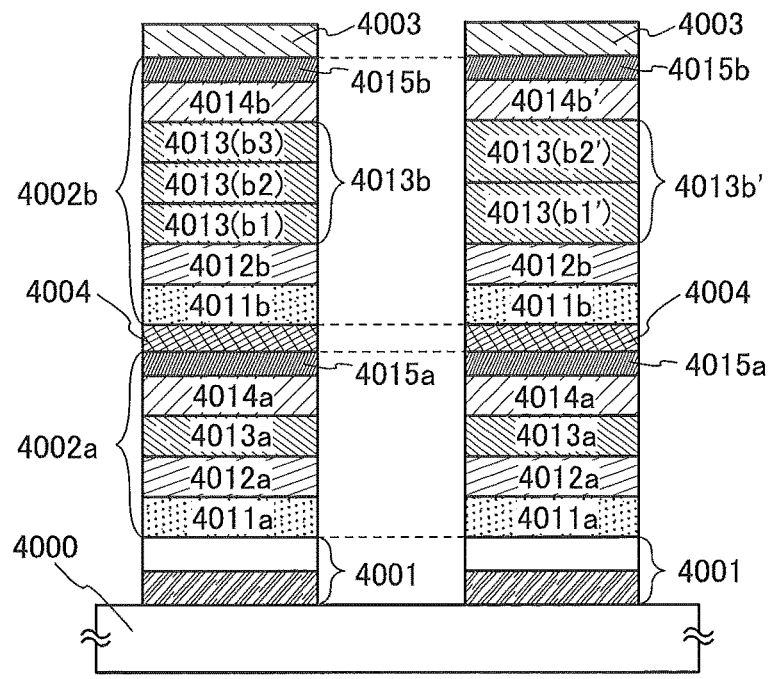
FIGS. 14A and 14B illustrate structures of Light-emitting Element 3, Comparative Light-emitting Element 4, Light-emitting Element 5, and Comparative Light-emitting Element 6.

As light-emitting elements in this example, Light-emitting Element 3 and Comparative Light-emitting Element 4 are shown on the left side of FIG. 14A and the right side of FIG. 14A, respectively, and Light-emitting Element 3 and Comparative Light-emitting Element 4 both emit green light. Furthermore, Light-emitting Element 5 and Comparative Light-emitting Element 6 are shown on the left side of FIG. 14B and the right side of FIG. 14B, respectively, and Light-emitting Element 5 and Comparative Light-emitting Element 6 both emit red light. Note that in each of the light-emitting elements, light is emitted from the second electrode 4003 side.

Figure 14B:
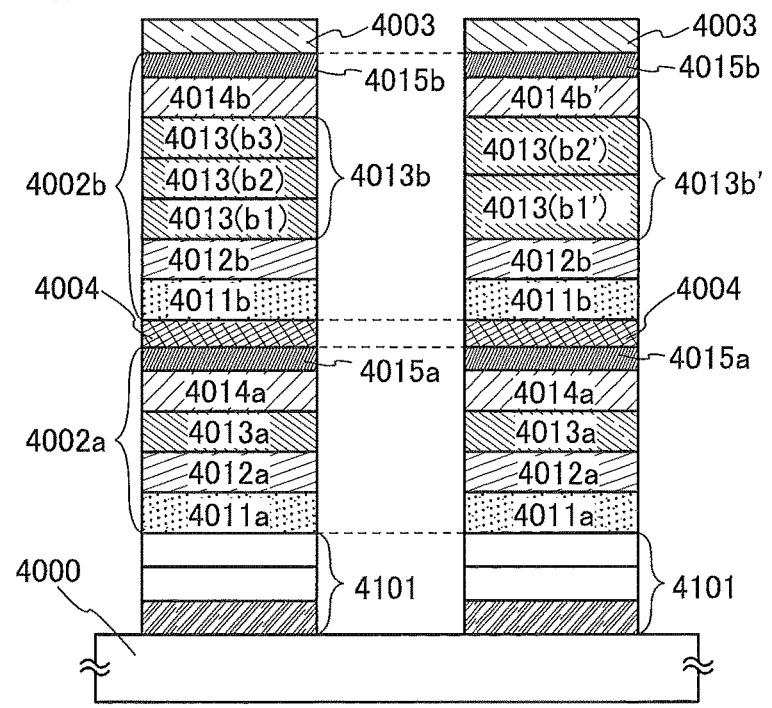

Light-emitting Element 3 and Comparative Light-emitting Element 4 in FIG. 14A are different from each other in only a structure of a light-emitting layer (4013b,4013b') in a second EL layer 4002b. Light-emitting Element 5 and Comparative Light-emitting Element 6 in FIG. 14B are also different from each other in only a structure of a light-emitting layer (4013b, 4013b') in the second EL layer 4002b. Furthermore, Light-emitting Element 3 and Comparative Light-emitting Element 4 in FIG. 14A are optically adjusted to emit green light and Light-emitting Element 5 and Comparative Light-emitting Element 6 in FIG. 14B are optically adjusted to emit red light; thus, a first electrode 4101 in FIG. 14B and a first electrode 4001 in FIG. 14A have different structures. Other common components are denoted by the same reference numerals in FIGS. 14A and 14B.

First, an alloy film of an aluminum (Al), nickel (Ni), and lanthanum (La) (Al—Ni—La alloy film) with a thickness of 200 nm was deposited over a glass substrate 4000 by a sputtering method, a film of Ti with a thickness of 6 nm was deposited by a sputtering method, and then a film of indium tin oxide containing silicon oxide (ITSO) with a thickness of 40 nm was deposited by a sputtering method. As a result, the first electrode 4001 of each of Light-emitting Element 3 and Comparative Light-emitting Element 4, which functions as an anode, was formed (FIG. 14A). In each of Light-emitting Element 5 and Comparative Light-emitting Element 6, an alloy film of an aluminum (Al), nickel (Ni), and lanthanum (La) (Al—Ni—La alloy film) with a thickness of 200 nm was deposited over the substrate 4000 by a sputtering method, a film of Ti with a thickness of 6 nm was deposited by a sputtering method, and then indium tin oxide containing silicon oxide (ITSO) with a thickness of 75 nm was deposited by a sputtering method, whereby the first electrode 4101, which functions as an anode, was formed. At this time, the films of Ti were partially or entirely oxidized and contained titanium oxide. Note that the electrode area was 2 mm×2 mm.

Then, as pretreatment for forming Light-emitting Element 3, Comparative Light-emitting Element 4, Light-emitting Element 5, and Comparative Light-emitting Element 6 over the substrate 4000, UV ozone treatment was performed for 370 seconds after washing of a surface of the substrate with water and 1-hour baking at 200° C.

After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 4000 was cooled down for about 30 minutes.

Next, the substrate 4000 was fixed to a holder provided in the vacuum evaporation apparatus so that a surface of the substrate 4000 provided with the first electrodes (4001 and 4101) was directed downward. In this example, by a vacuum evaporation method, a first hole-injection layer 4011a, a first hole-transport layer 4012a, a light-emitting layer (A) (4013a), a first electron-transport layer 4014a, and a first electron-injection layer 4015a, which are included in a first EL layer 4002a, were sequentially formed, and then a charge generation layer 4004 was formed. After that, a second hole-injection layer 4011b, a second hole-transport layer 4012b, a light-emitting layer (B) (4013b or 4013b'), a second electron-transport layer (4014b, 4014b'), and a second electron-injection layer 4015b, which are included in a second EL layer 4002b, were sequentially formed.

After reducing the pressure in the vacuum evaporation apparatus to $10^{-4}$ Pa, 9-[4-(9-phenyl-9H-carbazol-3-yl)phenyl]phenanthrene (abbreviation: PcPPn) and molybdenum oxide were co-evaporated at a mass ratio of 1:0.5 (PcPPn (abbreviation):molybdenum oxide), whereby the first hole-injection layer 4011a was formed over each of the first electrodes (4001 and 4101). Note that co-evaporation is an evaporation method in which some different substances are evaporated from some different evaporation sources at the same time. The thicknesses of the first hole-injection layer 4011a were 13.5 nm, 10 nm, 21 nm, and 10 nm in the case of Light-emitting Element 3, Comparative Light-emitting Element 4, Light-emitting Element 5, and Comparative Light-emitting Element 6, respectively.

Then, PcPPn (abbreviation) was deposited by evaporation, so that the first hole-transport layer 4012a was formed. The thicknesses of the first hole-transport layer 4012a were 10 nm, 15 nm, 10 nm, and 15 nm in the case of Light-emitting Element 3, Comparative Light-emitting Element 4, Light-emitting Element 5, and Comparative Light-emitting Element 6, respectively.

Next, a light-emitting layer (A) 4013a was formed over the first hole-transport layer 4012a. The light-emitting layer (A) 4013a was formed by co-evaporation of 9-[4-(10-phenyl-9-anthracenyl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) at a mass ratio of 1:0.05 (CzPA (abbreviation):1,6mMemFLPAPrn (abbreviation)). The thickness thereof was set to 25 nm.

Next, the first electron-transport layer 4014a was formed over the light-emitting layer (A) 4013a in such a manner that a film of CzPA (abbreviation) was deposited by evaporation to a thickness of 5 nm and then a film of bathophenanthroline (abbreviation: BPhen) was deposited by evaporation to a thickness of 15 nm. In addition, lithium oxide ($Li_2O$) was deposited by evaporation to a thickness of 0.1 nm over the first electron-transport layer 4014a, whereby the first electron-injection layer 4015a was formed.

Then, copper phthalocyanine (abbreviation: CuPc) was deposited by evaporation to a thickness of 2 nm over the first electron-injection layer 4015a, whereby the charge generation layer 4004 was formed.

Next, over the charge generation layer 4004, 1,3,5-tri (dibenzothiophen-4-yl)benzene (abbreviation: DBT3P-II) and molybdenum oxide were co-evaporated to a thickness of 12.5 nm at a mass ratio of 1:0.5 (DBT3P-II (abbreviation): molybdenum oxide), whereby the second hole-injection layer 4011b was formed.

Then, the second hole-transport layer 4012b was formed by depositing BPAFLP (abbreviation) by evaporation to a thickness of 20 nm.

Next, the light-emitting layer (B) (4013b, 4013b') was formed over the second hole-transport layer 4012b.

The light-emitting layer (B) 4013b included in each of Light-emitting Element 3 and Light-emitting Element 5 (light-emitting elements on the left sides of FIGS. 14A and 14B) has a stacked-layer structure of three layers of a first light-emitting layer 4013(b1), a second light-emitting layer 4013(b2), and a third light-emitting layer 4013(b3).

The first light-emitting layer 4013(b1) was formed to have a thickness of 20 nm by co-evaporating 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and (Acetylacetonato)bis(6-tert-butyl-4-phenylpyrimidinato)iridium(III) (abbreviation: [Ir(tBuppm)$_2$(acac)]) at a mass ratio of 0.8:0.2:0.06 (2mDBTBPDBq-II:PCBBiF:[Ir(tBuppm)$_2$(acac)]).

The second light-emitting layer 4013(b2) was formed to have a thickness of 10 nm by co-evaporating 2mDBTBP-DBq-II (abbreviation), PCBBiF (abbreviation), and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: [Ir(dmdppr-dmp)$_2$(acac)]) at a mass ratio of 0.9:0.1:0.06 (2mDBTBPDBq-II:PCBBiF:[ft(dmdppr-dmp)$_2$(acac)]).

The third light-emitting layer 4013(b3) was formed to have a thickness of 10 nm by co-evaporating 2mDBTBP-DBq-II (abbreviation), PCBBiF (abbreviation), and [Ir(tBuppm)$_2$(acac)] (abbreviation) at a mass ratio of 0.8:0.2:0.06 (2mDBTBPDBq-II:PCBBiF:[Ir(tBuppm)$_2$(acac)].

The light-emitting layer (B) 4013b' has a stacked-layer structure of two layers of a first light-emitting layer 4013(b1') and a second light-emitting layer 4013(b2') included in Comparative Light-emitting Element 4 and Comparative Light-emitting. Element 6 (light-emitting elements on the right sides of FIGS. 14A and 14B).

The first light-emitting layer 4013(b1') was formed to have a thickness of 20 nm by co-evaporating 2mDBTBP-DBq-II (abbreviation), PCBBiF (abbreviation), and [Ir(tBuppm)$_2$(acac)] (abbreviation) at a mass ratio of 0.8:0.2:0.06 (2mDBTBPDBq-II:PCBBiF:[Ir(tBuppm)$_2$(acac)]).

The second light-emitting layer 4013(b2') was formed to have a thickness of 20 nm by co-evaporating 2mDBTBP-DBq-II (abbreviation) and [Ir(dmdppr-dmp)$_2$(acac)] (abbreviation) at a mass ratio of 1:0.06 (2mDBTBPDBq-II:[Ir(dmdppr-dmp)$_2$(acac)]).

Next, the second electron-transport layer (4014b, 4014b') was formed over the light-emitting layer (B) (4013b, 4013b').

Next, the second electron-transport layer 4014b included in each of Light-emitting Element 3 and Light-emitting Element 5 (light-emitting elements on the left sides of FIGS. 14A and 14B) was formed in such a manner that a film of 2mDBTPDBq-II (abbreviation) was deposited by evaporation to a thickness of 30 nm and then a film of BPhen (abbreviation) was deposited by evaporation to a thickness of 15 nm. Furthermore, the second electron-transport layer 4014b' included in each of Light-emitting Element 4 and Light-emitting Element 6 (light-emitting elements on the right sides of FIGS. 14A and 14B) was formed in such a manner that a film of 2mDBTPDBq-II (abbreviation) was deposited by evaporation to a thickness of 35 nm and then a film of BPhen (abbreviation) was deposited by evaporation to a thickness of 15 nm.

In addition, a film of lithium fluoride (LiF) was formed by evaporation to a thickness of 1 nm, whereby the second electron-injection layer 4015b was formed over the second electron-transport layers (4014b and 4014b').

Finally, the second electrode 4003 serving as a cathode was formed over the second electron-injection layer 4015b. The second electrode 4003 was obtained in such a manner that silver (Ag) and magnesium (Mg) were deposited by co-evaporation at a mass ratio of 1:0.1 to a thickness of 15 nm and then indium tin oxide (ITO) was deposited to a thickness of 70 nm by a sputtering method. Note that in all the above evaporation steps, evaporation was performed by a resistance heating method.

Element structures of Light-emitting Element 3, Comparative Light-emitting Element 4, Light-emitting Element 5, and Comparative Light-emitting Element 6 obtained through the above steps are shown in Table 3.

TABLE 3

|  | First electrode | First hole-injection layer | First hole-transport layer | Light-emitting layer (A) | First electron-transport layer |
|---|---|---|---|---|---|
| Light-emitting Element 3 | Al—Ni—La\Ti (200 nm\6 nm) | NITO (40 nm) | PCPPn:MoOx (1:0.5 13.5 nm) | PCPPn (10 nm) | * | CzPA (5 nm) | Bphen (15 nm) |
| Comparative Light-emitting Element 4 |  |  | PCPPn:MoOx (1:0.5 10 nm) | PCPPn (15 nm) |  |  |
| Light-emitting Element 5 |  | NITO (75 nm) | PCPPn:MoOx (1:0.5 21 nm) | PCPPn (10 nm) |  |  |
| Comparative Light-emitting Element 6 |  |  | PCPPn:MoOx (1:0.5 10 nm) | PCPPn (15 nm) |  |  |

|  | First electron-injection layer | Charge-generation layer | Second hole-injection layer | Second hole-transport layer | Light-emitting layer (B) | | |
|---|---|---|---|---|---|---|---|
|  |  |  |  |  | 1st 1st | 2nd 2nd | 3rd |
| Light-emitting Element 3 | Li$_2$O (0.1 nm) | CuPc (2 nm) | DBT3P-II:MoOx (1:0.5 12.5 nm) | BPAFLP (20 nm) | ** | *** | **** |
| Comparative Light-emitting Element 4 |  |  |  |  |  | ***** |  |

TABLE 3-continued

| | | | | | | |
|---|---|---|---|---|---|---|
| Light-emitting Element 5 | | | | *** | **** | |
| Comparative Light-emitting Element 6 | | | | | ***** | |

| | Second electron-transport layer | | Second electron-injection layer | Second electrode | | CF |
|---|---|---|---|---|---|---|
| Light-emitting Element 3 | 2mDBTBPDBq-II (30 nm) | Bphen (15 nm) | LiF (1 nm) | Ag:Mg (1:0.1 15 nm) | ITO (70 nm) | G |
| Comparative Light-emitting Element 4 | 2mDBTBPDBq-II (35 nm) | | | | | |
| Light-emitting Element 5 | 2mDBTBPDBq-II (30 nm) | | | | | R |
| Comparative Light-emitting Element 6 | 2mDBTBPDBq-II (35 nm) | | | | | |

\* CzPA:1,6mMemFLPAPrn (1:0.05 25 nm)
\*\* 2mDBTBPDBq-II:PCBBiF:[Ir(tBuppm)$_2$(acac)] (0.8:0.2:0.06 20 nm)
\*\*\* 2mDBTBPDBq-II:PCBBiF:[Ir(dmdppr-dmp)$_2$(acac)] (0.9:0.1:0.06 10 nm)
\*\*\*\* 2mDBTBPDBq-II:PCBBiF:[Ir(tBuppm)$_2$(acac)] (0.8:0.2:0.06 10 nm)
\*\*\*\*\* 2mDBTBPDBq-II:[Ir(dmdppr-dmp)$_2$(acac)] (1:0.06 20 nm)

As shown in Table 3, a green coloring layer (G) was formed in a counter substrate of Light-emitting Element 3 and Comparative Light-emitting Element 4, and a red coloring layer (R) was formed in a counter substrate of Light-emitting Element 5 and Comparative Light-emitting Element 6. The fabricated Light-emitting Element 3, Comparative Light-emitting Element 4, Light-emitting Element 5, and Comparative Light-emitting Element 6 were sealed by being bonded to these counter substrates in a glove box containing a nitrogen atmosphere so as not to be exposed to the air (specifically, a sealant was applied onto an outer edge of the element, and the sealant was irradiated with ultraviolet light with a wavelength of 365 nm at 6 J/cm$^2$ and heat treatment was performed at 80° C. for 1 hour at the time of sealing).

<<Operation Characteristics of Light-Emitting Element 3, Comparative Light-Emitting Element 4, Light-Emitting Element 5, and Comparative Light-Emitting Element 6>>

Figure 15:
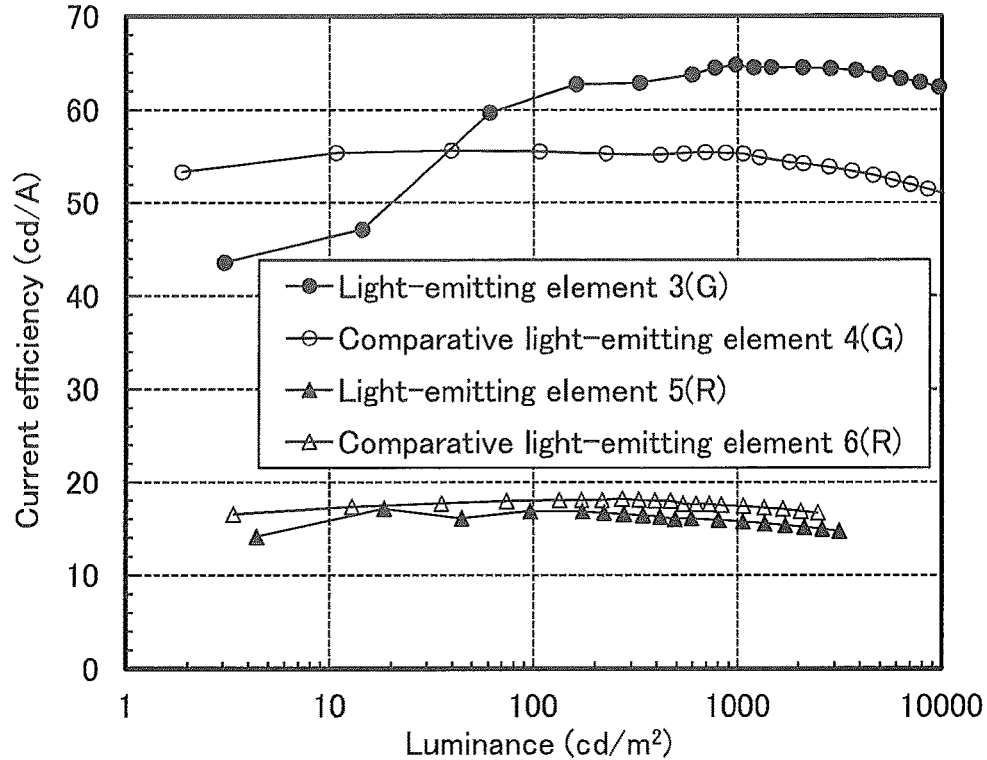
FIG. 15 shows luminance-current efficiency characteristics of Light-emitting Element 3, Comparative Light-emitting Element 4, Light-emitting Element 5, and Comparative Light-emitting Element 6.

Operation characteristics of Light-emitting Element 3, Comparative Light-emitting Element 4, Light-emitting Element 5, and Comparative Light-emitting Element 6 were evaluated. Note that the measurement was carried out at room temperature (under an atmosphere in which the temperature was kept at 25° C.). In FIG. 15, to the numbers of elements in a legend, (G) and (R) are added in the case of the light-emitting element that emits green light and in the case of the light-emitting element that emits red light, respectively, to show the light-emitting color of each light-emitting element. Moreover, the same applies to FIG. 17.

Figure 16:
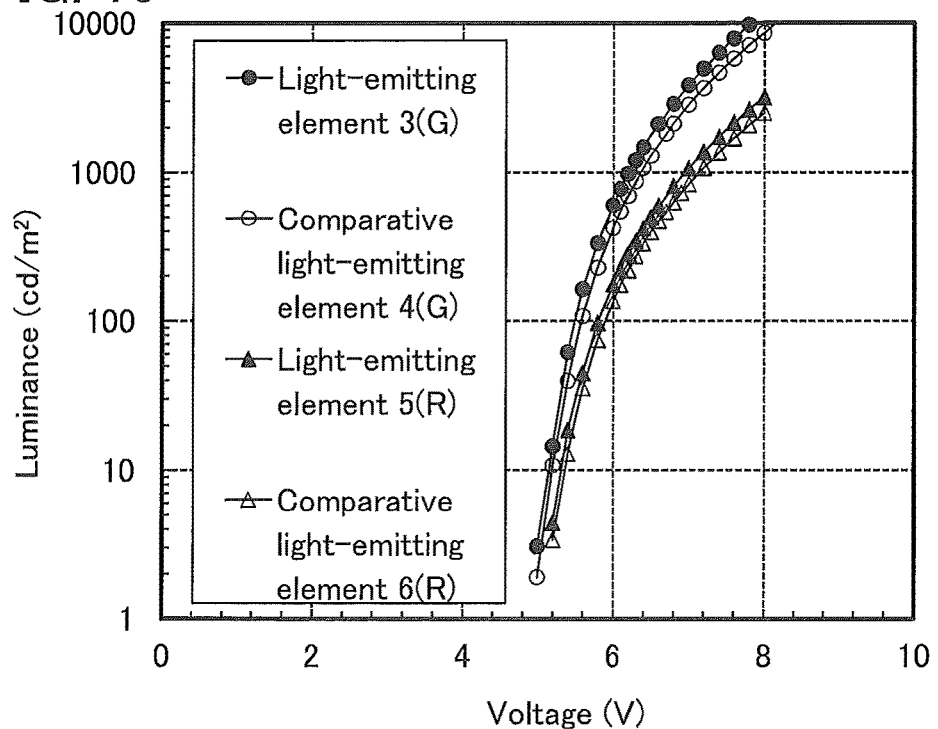
FIG. 16 shows voltage-luminance characteristics of Light-emitting Element 3, Comparative Light-emitting Element 4, Light-emitting Element 5, and Comparative Light-emitting Element 6.

First, FIG. 15 shows luminance-current efficiency characteristics of Light-emitting Element 3, Comparative Light-emitting Element 4, Light-emitting Element 5, and Comparative Light-emitting Element 6. In FIG. 15, the vertical axis represents current efficiency (cd/A) and the horizontal axis represents luminance (cd/m$^2$). Furthermore, FIG. 16 shows voltage-luminance characteristics of Light-emitting Element 3, Comparative Light-emitting Element 4, Light-emitting Element 5, and Comparative Light-emitting Element 6. In FIG. 16, the vertical axis represents luminance (cd/m$^2$) and the horizontal axis represents voltage (V).

Table 4 shows initial values of main characteristics of Light-emitting Element 3, Comparative Light-emitting Element 4, Light-emitting Element 5, and Comparative Light-emitting Element 6 at a luminance of approximately 1000 cd/m$^2$.

TABLE 4

| | Voltage (V) | Current (mA) | Current density (mA/cm$^2$) | Chromaticity (x, y) | Luminance (cd/m$^2$) | Current efficiency (cd/A) |
|---|---|---|---|---|---|---|
| Light-emitting Element 3 | 6.2 | 0.06 | 1.5 | (0.27, 0.71) | 970 | 65 |
| Comparative Light-emitting Element 4 | 6.4 | 0.077 | 1.9 | (0.26, 0.72) | 1100 | 55 |
| Light-emitting Element 5 | 7.0 | 0.27 | 6.8 | (0.67, 0.33) | 1100 | 16 |

TABLE 4-continued

| | Voltage (V) | Current (mA) | Current density (mA/cm$^2$) | Chromaticity (x, y) | Luminance (cd/m$^2$) | Current efficiency (cd/A) |
|---|---|---|---|---|---|---|
| Comparative Light-emitting Element 6 | 7.2 | 0.25 | 6.2 | (0.67, 0.33) | 1100 | 17 |

From the above results, it can be found that Light-emitting Element 3 and Comparative Light-emitting Element 4 fabricated in this example emit green (G) light, and Light-emitting Element 5 and Comparative Light-emitting Element 6 fabricated in this example emit red (R) light, which is clearly different from green light. Thus, these light-emitting elements are used in appropriate combination, whereby full-color display can be fabricated.

Figure 17:
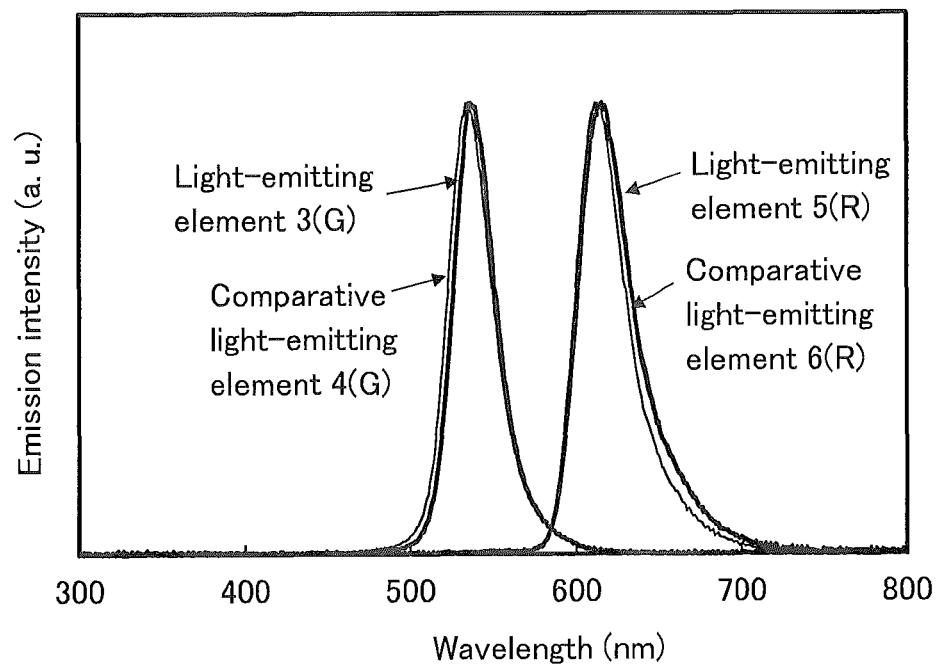
FIG. 17 shows emission spectra of Light-emitting Element 3, Comparative Light-emitting Element 4, Light-emitting Element 5, and Comparative Light-emitting Element 6.

FIG. 17 shows emission spectra when a current with a current density of 2.5 mA/cm$^2$ was supplied to Light-emitting Element 3, Comparative Light-emitting Element 4, Light-emitting Element 5, and Comparative Light-emitting Element 6. As shown in FIG. 17, the emission spectra of Light-emitting Element 3 and Comparative Light-emitting Element 4 both have peaks at approximately 536 nm, and the emission spectra of Light-emitting Element 5 and Comparative Light-emitting Element 6 both have peaks at approximately 616 nm, which indicates that the peak of each light-emitting element is attributed to light emission from a phosphorescent organometallic iridium complex included in each light-emitting layer.

When Light-emitting Element 3 and Comparative Light-emitting Element 4 each of which emits green light are compared with each other, although the current efficiency of Light-emitting Element 3(G) is higher than that of Comparative Light-emitting Element 4(G) in FIG. 15, the peak of emission spectrum of Light-emitting Element 3(G) is near to a wavelength of 550 nm, which is the wavelength with high luminosity in FIG. 17. These results suggest that the current efficiencies of Light-emitting Element 3(G) and Comparative Light-emitting Element 4(G) are almost the same with the same chromaticity. When Light-emitting Element 5 and Comparative Light-emitting Element 6 each of which emits red light are compared with each other, although the current efficiency of Light-emitting Element 5(R) is lower than that of Comparative Light-emitting Element 6(R) in FIG. 15, the emission spectrum of Light-emitting Element 5(R) is observed on the side of long wavelengths, which is the wavelength side with low luminosity in FIG. 17. Thus, the current efficiencies of Light-emitting Element 5(R) and Comparative Light-emitting Element 6(R) are the same when the light path lengths are presumably optimized. That is, Light-emitting Element 3 and Light-emitting Element 5 have initial characteristics similar to those of Comparative Light-emitting Element 4 and Comparative Light-emitting Element 6.

Figure 18:
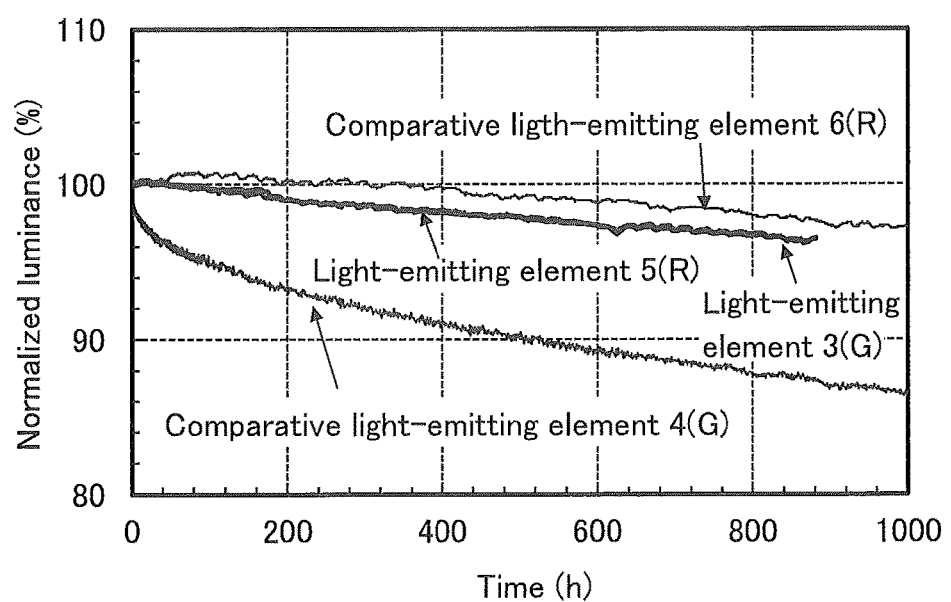
FIG. 18 shows reliability of Light-emitting Element 3, Comparative Light-emitting Element 4, Light-emitting Element 5, and Comparative Light-emitting Element 6.

FIG. 18 shows results of reliability tests of Light-emitting Element 3, Comparative Light-emitting Element 4, Light-emitting Element 5, and Comparative Light-emitting Element 6. In FIG. 18, the vertical axis represents normalized luminance (%) when an initial luminance is 100% and the horizontal axis represents driving time (h) of the element. Note that in the reliability tests, Light-emitting Element 3 and Comparative Light-emitting Element 4 were driven under the conditions where the initial luminance was set to 1667 cd/m$^2$ and the current density was constant, and Light-emitting Element 5 and Comparative Light-emitting Element 6 were driven under the conditions where the initial luminance was set to 655 cd/m$^2$ and the current density was constant. As a result, it is found that when the light-emitting layer (B) has a stacked-layer structure of three layers like in Light-emitting Element 3 and Light-emitting Element 5, in the case of Light-emitting Element 3 that emits green light, a rapid reduction in luminance in the initial stage of driving can be suppressed compared with Comparative Light-emitting Element 4 that also emits green light. Moreover, in the case of Light-emitting Element 5 that emits red light, a rapid increase in luminance in the initial stage of driving can be suppressed compared with Comparative Light-emitting Element 6 that also emits red light.

Note that the combination of 2mDBTBPDBq-II (abbreviation) and PCBBiF (abbreviation), which are used for the light-emitting layers (B) 4013b of Light-emitting Element 3 and Light-emitting Element 5 in this example, forms an exciplex.

Example 3

In this example, a 3.4-inch active matrix display fabricated using the light-emitting element of one embodiment of the present invention is described. In this 3.4-inch active matrix display, light-emitting layers in light-emitting elements have the same structures as the light-emitting layers of Light-emitting Element 3 and Light-emitting Element 5 in Example 2.

For a driver circuit portion of this 3.4-inch active matrix display, an FET using an oxide semiconductor was used.

Main specifications and characteristics of the fabricated 3.4-inch active matrix display are shown in Table 5 below.

TABLE 5

| Screen Diagonal | Driving Method | Resolution | Pixel Size | Pixel Density | Aperture Ratio | OLED Structure | Coloring Method | Emission Type | NTSC ratio | Pixel Circuit | Scan Driver | Source Driver |
|---|---|---|---|---|---|---|---|---|---|---|---|---|
| 3.4-inch | Active Matrix | 960 × (RGB) × 540 (Quarter-FHD) | 26 μm × 78 μm | 326 ppi | 44% | B\GRG | White OLED + Color Filter | Top emission | >90% | 3Tr + 1C/ pixel | Integrated | SSD |

* designed value

Figure 19:
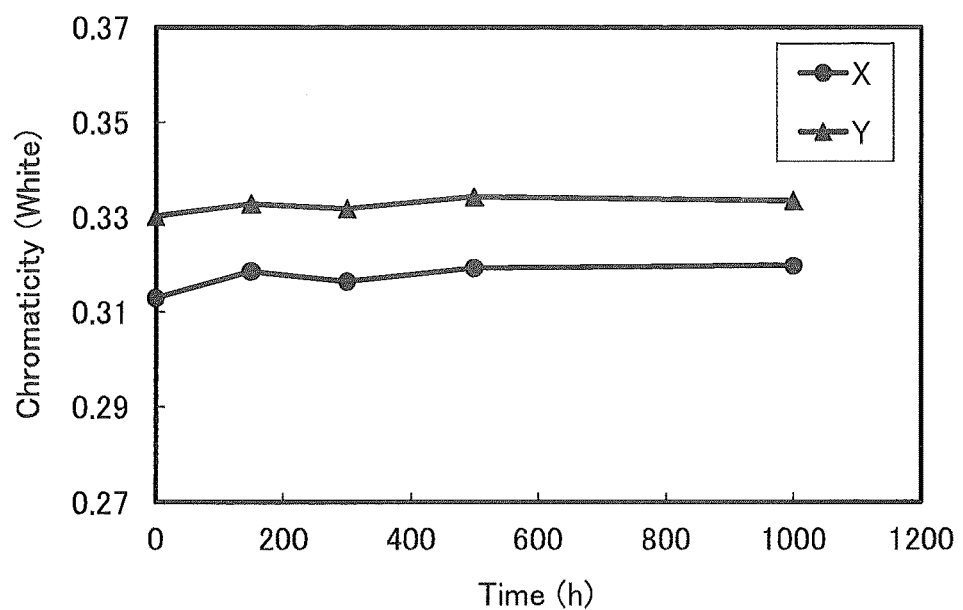
FIG. 19 shows time-chromaticity characteristics of a 3.4-inch active matrix display.

Moreover, FIG. 19 shows the measurement results of this display for a change in chromaticity over time when this display was continuously driven while emitting white light of 300 [cd/m$^2$] (chromaticity at approximately D65). From these results, it is found that the 3.4-inch active matrix display using light-emitting elements with the same structures as Light-emitting Element 3 and Light-emitting Element 5 in Example 2 has a small change in chromaticity over time like Light-emitting Element 3 and Light-emitting Element 5.

Example 4

In this example, Light-emitting Element 3 having the same structure as Light-emitting Element 3 in Example 2 and Light-emitting Element 5 having the same structure as Light-emitting Element 5 in Example 2 were fabricated, and the analysis results thereof by time-of-flight secondary ion mass spectrometry (ToF-SIMS) in the depth direction are shown. TOF.SIMS 5 (manufactured by ION-TOF GmbH) was used, and the analysis was performed using Bi as a primary ion source at less than or equal to 1E12 (ions/cm$^2$) in a positive mode. Furthermore, on each light-emitting element from which a second electrode (cathode) had been removed, the analysis was performed from the second electrode side to the first electrode side while digging was performed using GCIB (Ar cluster) as a sputtering ion source.

<ToF-SIMS in Depth Direction>

Figure 20A:
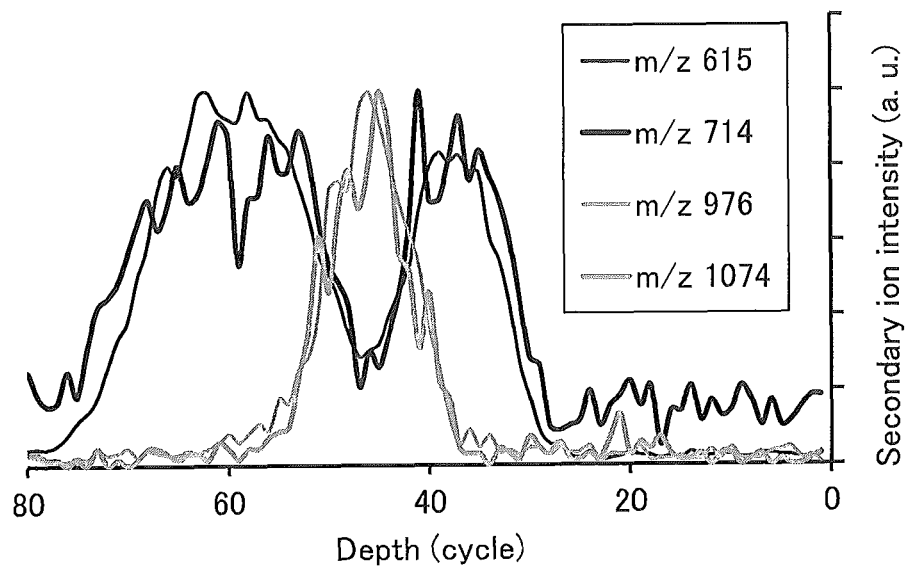
FIGS. 20A and 20B are graphs showing measurement results of Light-emitting Element 3 by ToF-SIMS.
Figure 20B:
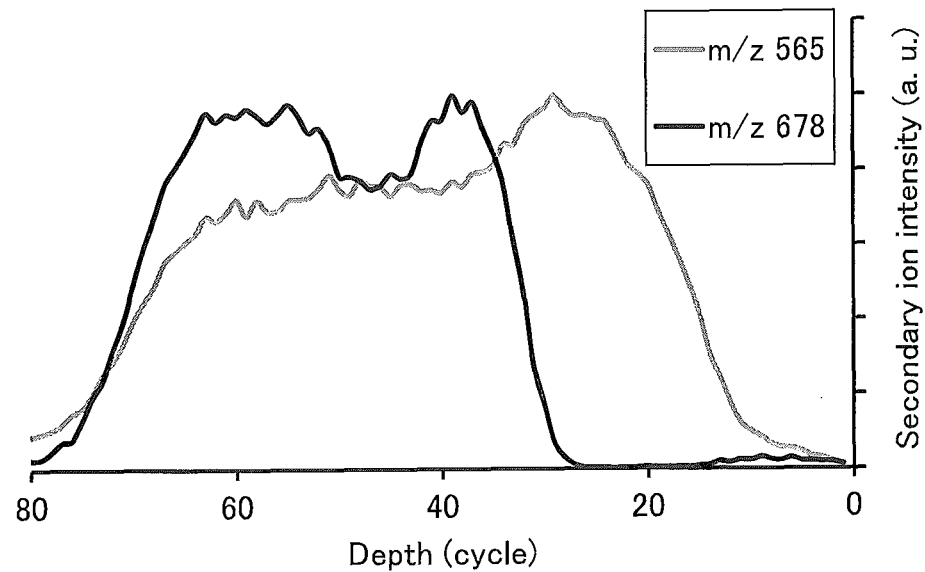
Figure 21A:
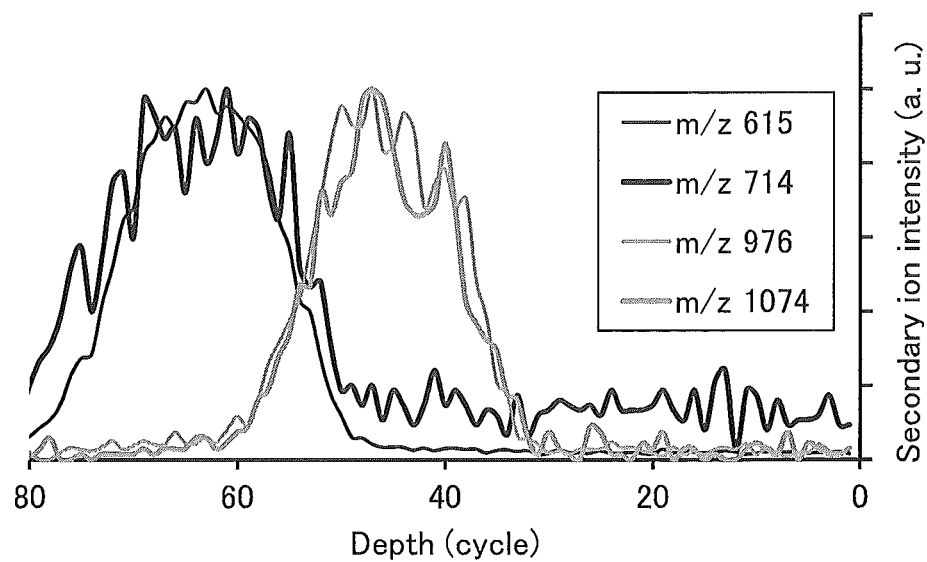
FIGS. 21A and 21B are graphs showing measurement results of Light-emitting Element 5 by ToF-SIMS.
Figure 21B:
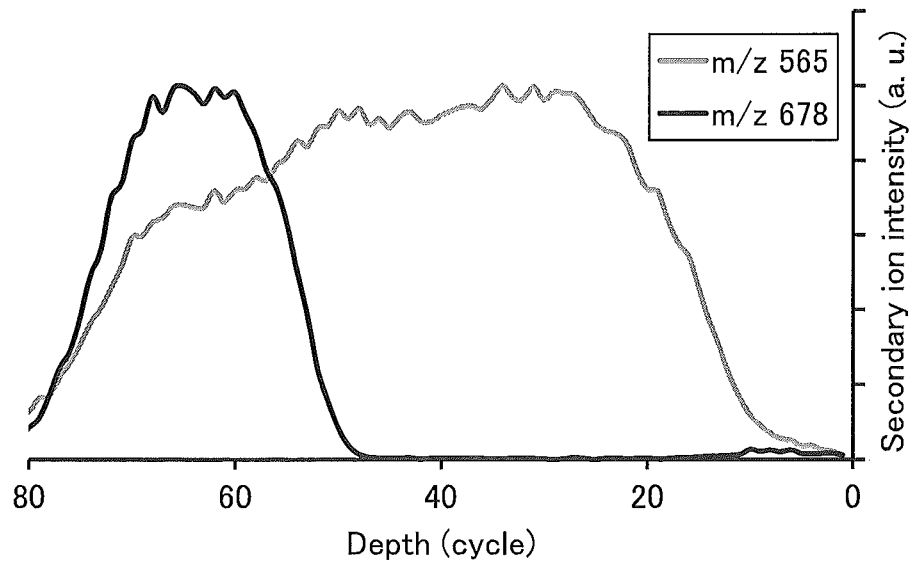

FIGS. 20A and 20B show results obtained by analysis of a region around the light-emitting layer (B) to the second electron-transport layer in Light-emitting Element 3 by the ToF-SIMS. The analysis results of Light-emitting Element 5 are shown in FIGS. 21A and 21B. In each graph, the vertical axis represents normalized secondary ion intensity and the horizontal axis represents depth, and 0 cycles indicates the start of digging. Thus, here, 0 cycles indicates a region around the second electron-injection layer on the cathode side. The scales of the horizontal axes in the figures (A) and (B) of the same element are the same. FIGS. 20A and 21A of these graphs show the secondary ion intensity when m/z=615, m/z=714, m/z=976, and m/z=1074. In addition, FIGS. 20B and 21B show the secondary ion intensity when m/z=565 and m/z=678.

From FIGS. 20A and 21A, it is found that profiles of m/z=615 and m/z=714 are similar to each other, and profiles of m/z=976 and m/z=1074 are similar to each other. Thus, it is suggested that m/z=714 is the mass-to-charge ratio mainly attributed to [Ir(tBuppm)$_2$(acac)], m/z=615 is the mass-to-charge ratio mainly attributed to a product ion that is formed by removing an acetylacetone group from [Ir(tBuppm)$_2$(acac)], m/z=1074 is the mass-to-charge ratio mainly attributed to [Ir(dmdppr-dmp)$_2$(acac)], and m/z=976 is the mass-to-charge ratio mainly attributed to a product ion that is formed by removing an acetylacetone group from [Ir(dmdppr-dmp)$_2$(acac)]. In addition, profiles of m/z=384 and m/z=599 are similar to that of m/z=714; thus it is suggested that the mass-to-charge ratios each of which is also mainly attributed to a product ion of [Ir(tBuppm)$_2$(acac)] are detected. Moreover, a profile of m/z=976 is similar to that of m/z=1074; thus, it is suggested that the mass-to-charge ratio which is also mainly attributed to a product ion of [Ir(dmdppr-dmp)$_2$(acac)] is detected.

Furthermore, from profiles and mass-to-charge ratios of FIGS. 20B and 21B, it is suggested that m/z=565 is the mass-to-charge ratio which is mainly attributed to 2mDBT-BPDBq-II, and m/z=678 is the mass-to-charge ratio which is mainly attributed to a product ion of PCBBiF. In addition, profiles of m/z=176 and m/z=201 are similar to that of m/z=565; thus, it is suggested that the mass-to-charge ratios each of which is also mainly attributed to a product ion of 2mDBTBPDBq-II are detected.

In FIG. 20A that shows the analysis results of Light-emitting Element 3, an ion has two peaks attributed to [Ir(tBuppm)$_2$(acac)], and a peak attributed to [Ir(dmdppr-dmp)$_2$(acac)] is shown between these peaks. On the other hand, in FIG. 21A that shows the analysis results of Light-emitting Element 5, it is observed that a peak attributed to [Ir(dmdppr-dmp)$_2$(acac)] is adjacent to a peak attributed to [Ir(tBuppm)$_2$(acac)]. From these results, it is found that a profile of even a thin film with a thickness of 10 nm to 20 nm can be observed by an analysis method using the ToF-SIMS.

From FIGS. 20A, 20B, 21A, and 21B, it is found that ions contained in the element structure can be analyzed by the ToF-SIMS. Moreover, it is found that profiles of ions of a substance contained in a stacked film of other layers (the first hole-injection layer to the second hole-transport layer) can be obtained in the stacking order and analyzed by the ToF-SIMS.

<ToF-SIMS of Light-Emitting Layer>

Figure 22A:
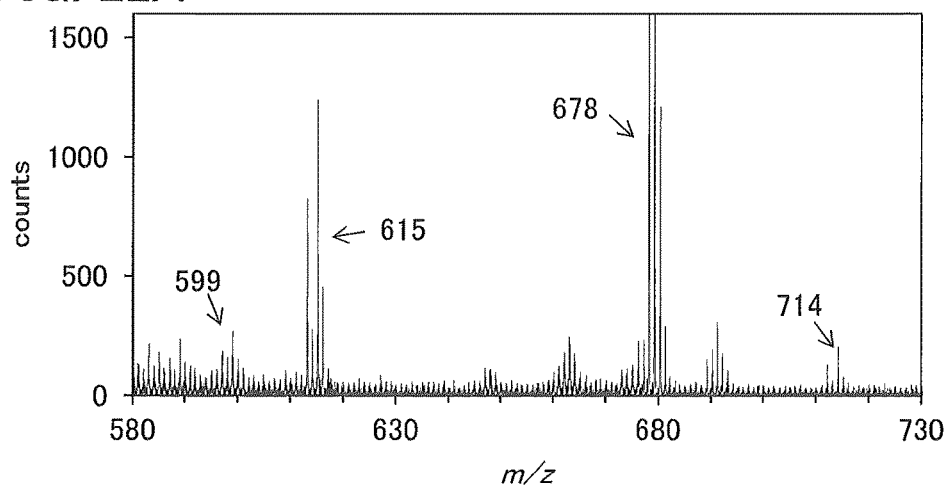
FIGS. 22A to 22C are graphs showing measurement results of Light-emitting Element 3 by ToF-SIMS.
Figure 22B:
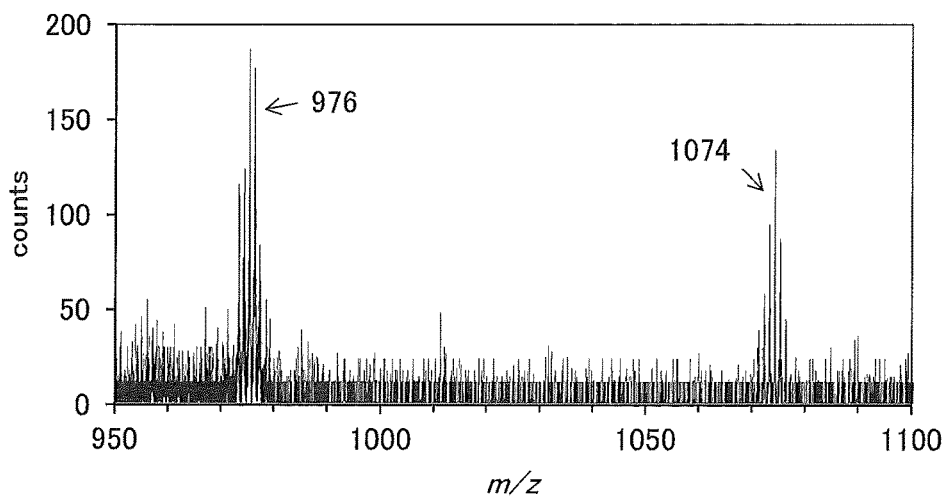
Figure 22C:
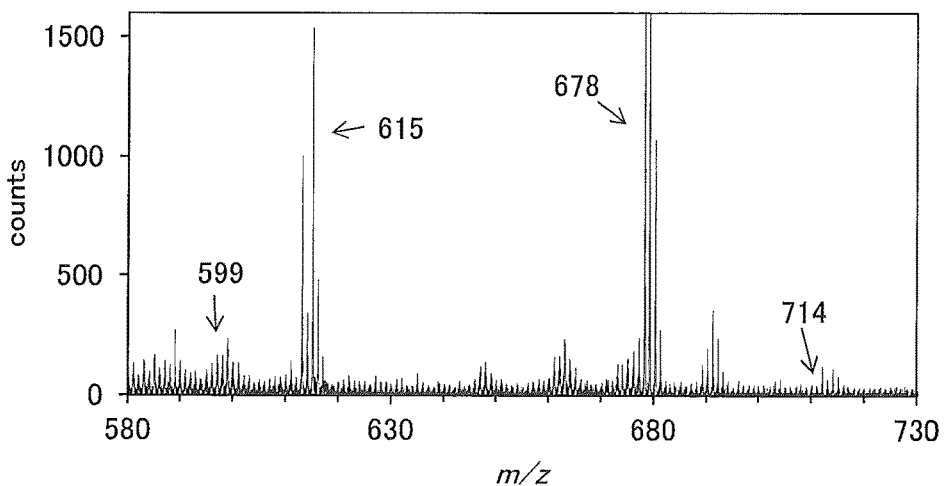

Next, regions around the third light-emitting layer (4013(*b*3)), the second light-emitting layer (4013(*b*2)), and the first light-emitting layer (4013(*b*1)) of the light-emitting layer (B) 4013*b* of Light-emitting Element 3 are each measured, and FIGS. 22A, 22B, and 22C show the measurement results around the third light-emitting layer (4013(*b*3)), the measurement results around the second light-emitting layer (4013(*b*2)), and the measurement results around the first light-emitting layer (4013(*b*1)) of the light-emitting layer (B) 4013*b*, respectively. FIG. 22A, FIG. 22B, and FIG. 22C correspond to the integral detection intensity in a 37 to 38 cycle portion, the integral detection intensity in a 46 to 47 cycle portion, and the integral detection intensity in a 58 to 59 cycle portion in FIGS. 20A and 20B, respectively. In FIGS. 22A to 22C, the vertical axis represents secondary ion intensity, and the horizontal axis represents mass-to-charge ratio.

Figure 23A:
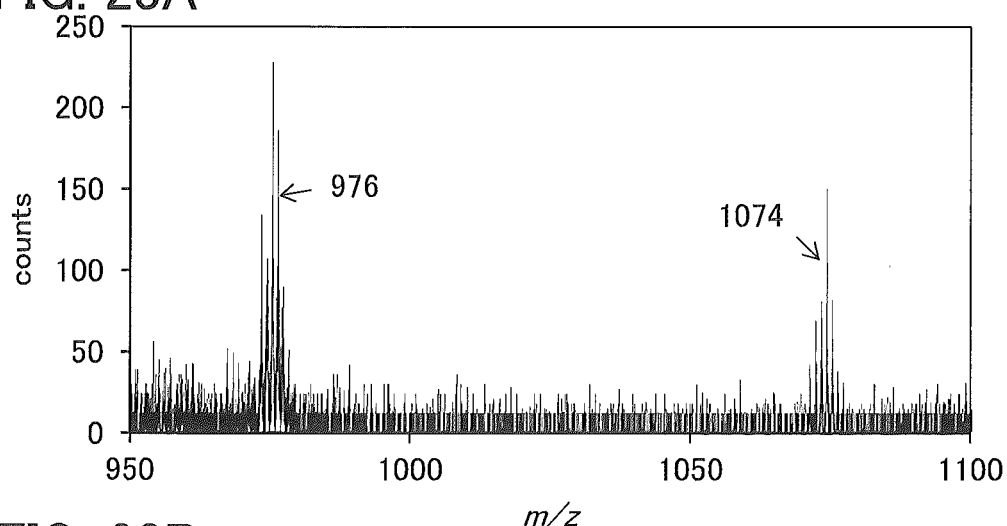
FIGS. 23A and 23B are graphs showing measurement results of Light-emitting Element 5 by ToF-SIMS.
Figure 23B:
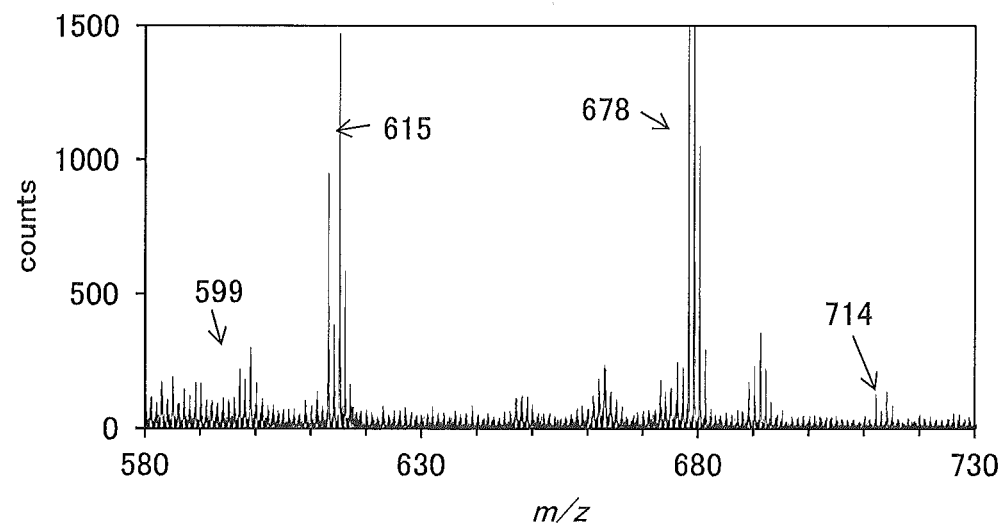

FIG. 23A shows the measurement results by the ToF-SIMS around the second light-emitting layer (4013(*b*2)) and the third light-emitting layer (4013(*b*3)) of the light-emitting layer (B) 4013*b* of Light-emitting Element 5, and FIG. 23B shows the measurement results by the ToF-SIMS around the first light-emitting layer (4013(*b*1)) of the light-emitting layer (B) 4013*b* of Light-emitting Element 5. FIG. 23A and FIG. 23B correspond to the integral detection intensity in a 45 to 46 cycle portion and the integral detection intensity in a 63 to 64 cycle portion in FIGS. 21A and 21B, respectively. In FIGS. 23A and 23B, the vertical axis represents secondary ion intensity, and the horizontal axis represents mass-to-charge ratio.

In FIG. 22A, FIG. 22C, and FIG. 23B, m/z=714, m/z=615, and m/z=599 attributed to [Ir(tBuppm)$_2$(acac)] and m/z=678 attributed to PCBBiF are observed. Furthermore, in FIG. 22B and FIG. 23A, m/z=1074 and m/z=976 attributed to [Ir(dmdppr-dmp)$_2$(acac)] are observed.

<ToF-SIMS of Single Film>

Figure 24:
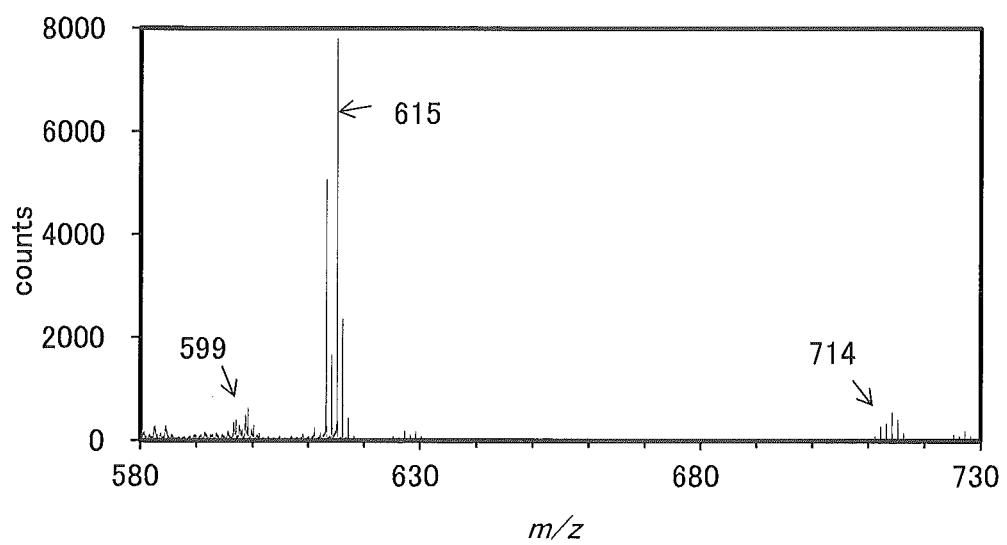
FIG. 24 is a graph showing measurement results of Light-emitting Element 3 by ToF-SIMS.

Next, a single film of [Ir(tBuppm)$_2$(acac)] included in the first light-emitting layer (4013(*b*1)) and the third light-emitting layer (4013(*b*3)) of the light-emitting layer (B) 4013*b* of Light-emitting Element 3 was formed by an evaporation method, and measurement was performed on the single film by the ToF-SIMS. FIG. 24 shows the measurement results. In FIG. 24, the vertical axis represents secondary ion intensity, and the horizontal axis represents mass-to-charge ratio.

From FIG. 24, it is found that m/z=714, m/z=615, and m/z=599, which are peaks attributed to [Ir(tBuppm)$_2$(acac)], are observed at the same product peak pattern as those in FIG. 22A, FIG. 22C, and FIG. 23B.

Note that in the case of a mixed film, when there is a mass-to-charge ratio that is the same as that of an ion of another material, the peaks overlap with each other and the intensity ratio might be changed; thus, attention needs to be paid.

From the above analysis results of the ToF-SIMS, it is found that in the substance contained in the light-emitting element, a product ion can be sensitively analyzed as in the case of the single film. Moreover, it is found that even in a sample with a low proportion of the substances and a sample with a thin film, a product ion can be analyzed by the ToF-SIMS.

In the case of a complex that is often used as a dopant in a light-emitting layer, a product ion with a structure from which one ligand is removed (mass-to-charge ratio: (P)/z) can be sensitively analyzed. The mass-to-charge ratio to be obtained is represented by (Formula 1). In (Formula 1), (C) represents precise mass of complex molecules, and (L) represents precise mass of ligands that are substituted. Note that (P)/z has a margin of error of plus or minus 2.

$$(P)/z=(C)-(L) \quad \text{(Formula 1)}$$

The ligand contained in the complex can have any of the following structures (Structural Formulae (100 to 111), (120 to 126), and (130 to 186)), for example.

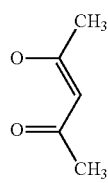

(100)

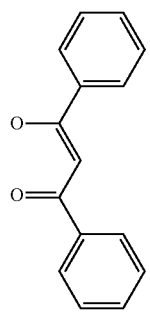

(101)

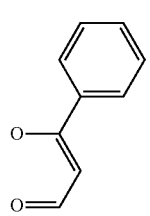

(102)

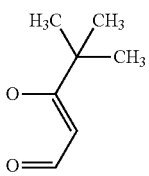

(103)

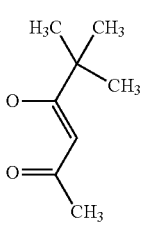

(104)

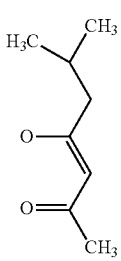

(105)

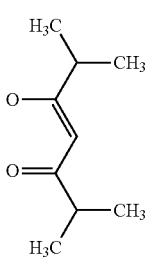

(106)

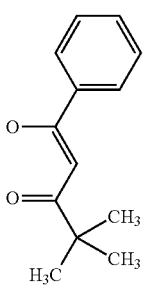

(107)

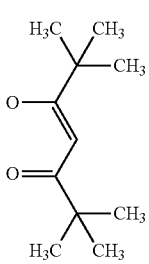

(108)

-continued
(109) 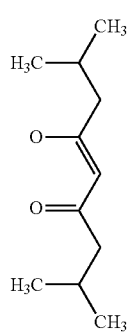
(110) 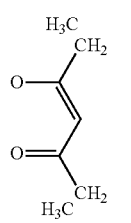
(111) 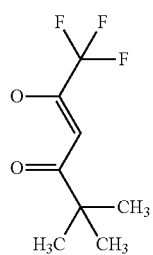
(120) 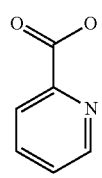
(121) 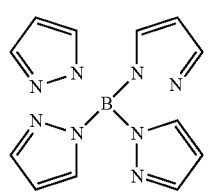
(122) 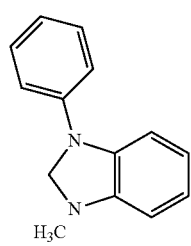
(123) 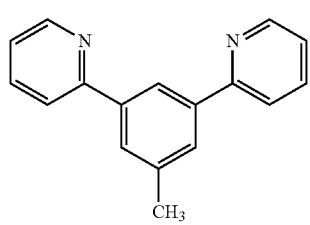
-continued
(124) 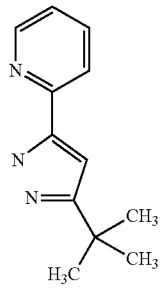
(125) 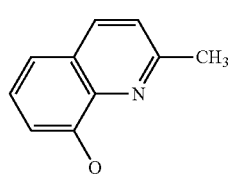
(126) 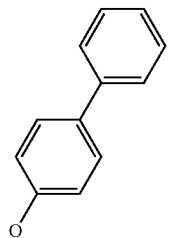
(130) 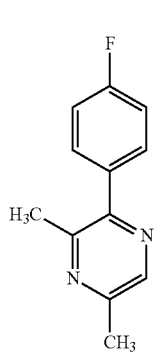
(131) 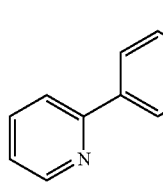
(132) 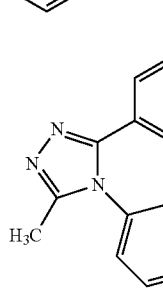

(133) 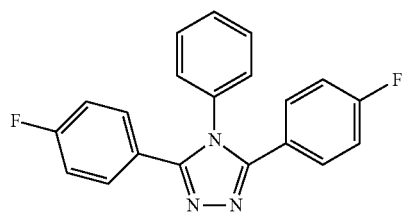
(139) 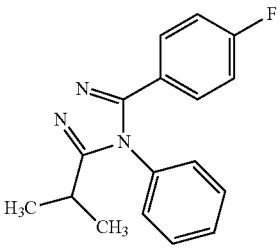
(134) 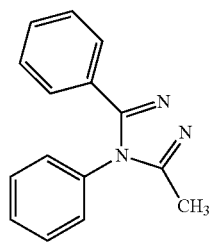
(140) 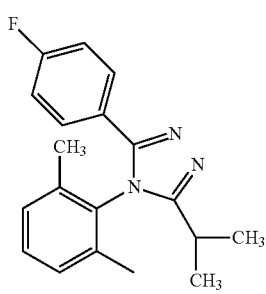
(135) 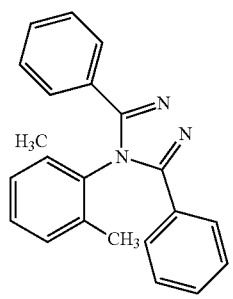
(141) 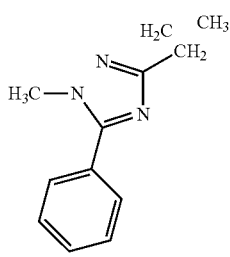
(136) 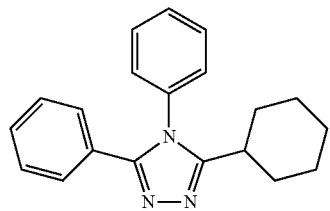
(142) 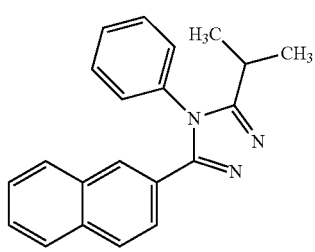
(137) 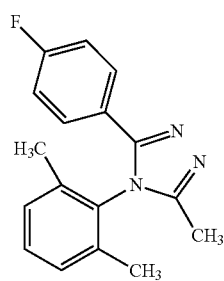
(143) 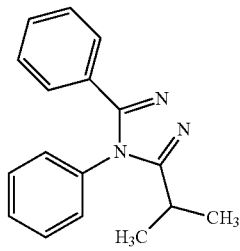
(138) 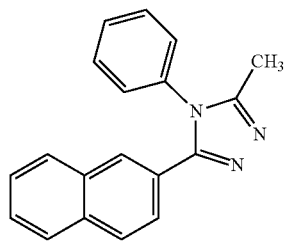
(144) 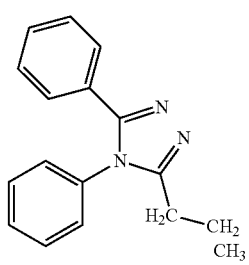

-continued (145)

(146)

(147)

(148)

(149)

(150)

-continued (151)

(152)

(153)

(154)

(155)

(156)
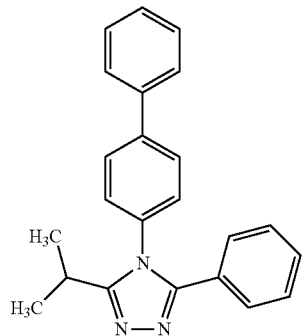
(157)
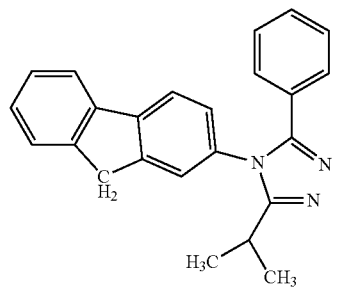
(158)
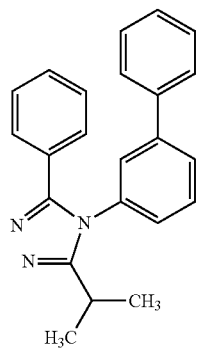
(159)
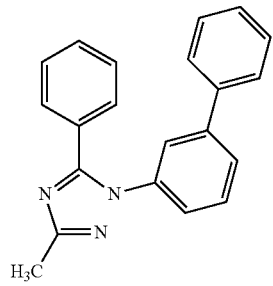
(160)
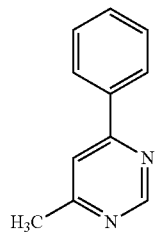
(161)
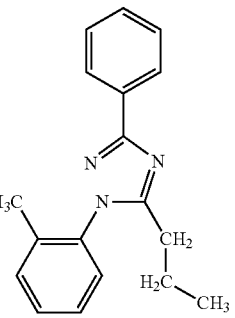
(162)
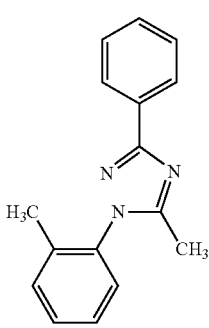
(163)
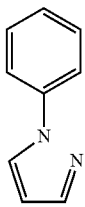
(164)
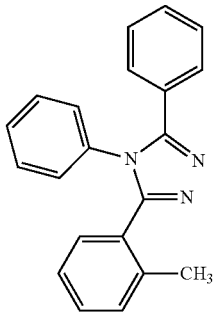
(165)
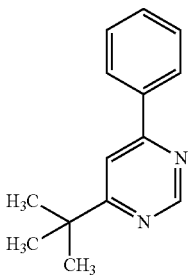

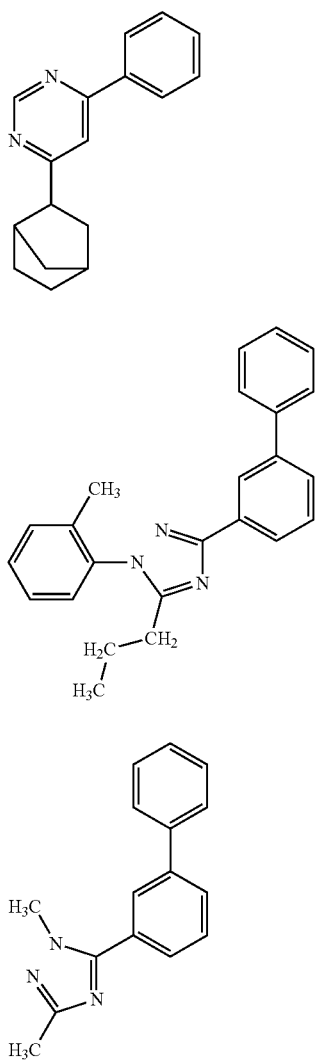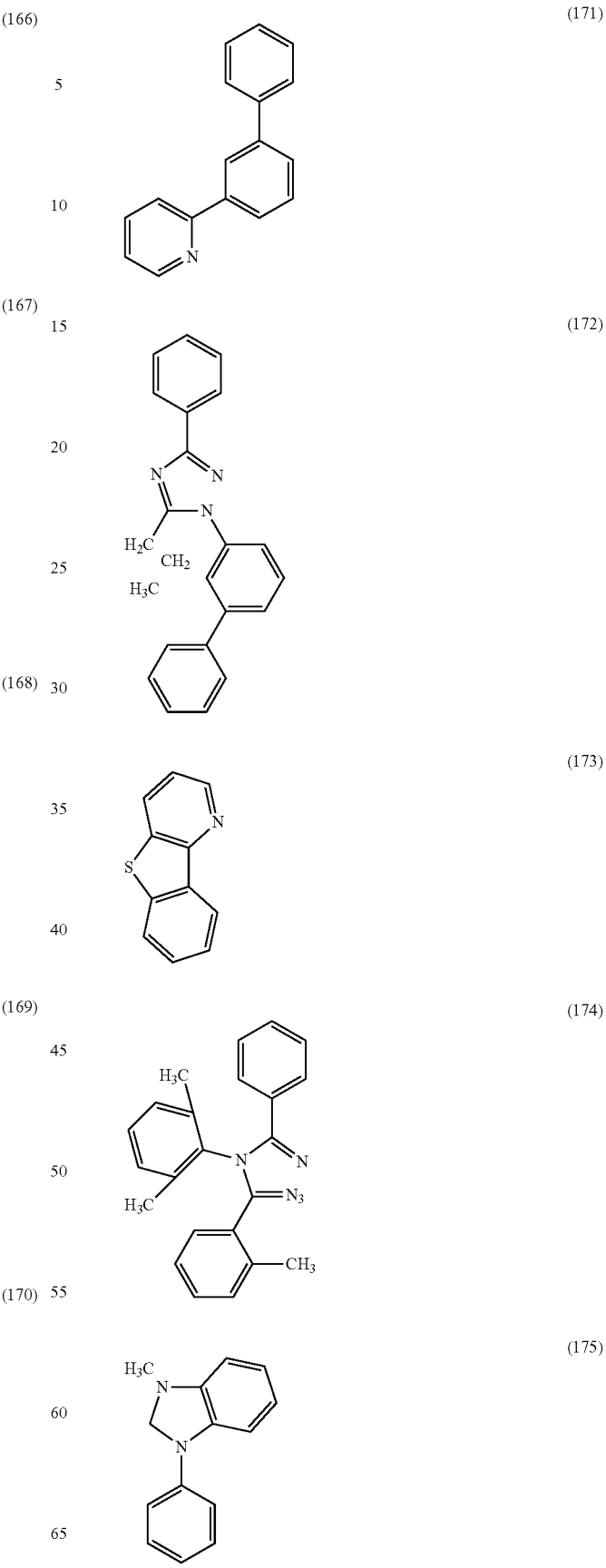

(176)
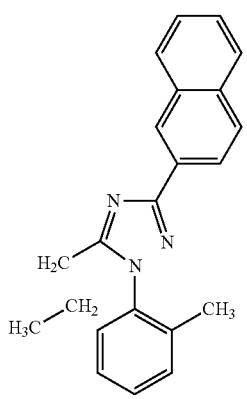

(177)
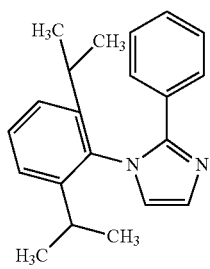

(178)
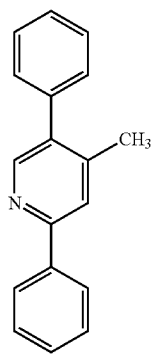

(179)
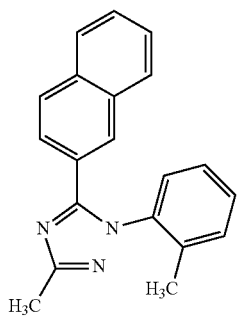

(180)
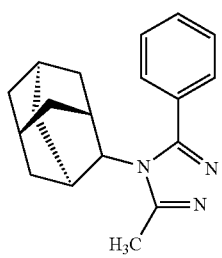

(181)
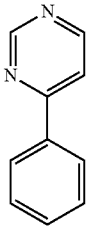

(182)
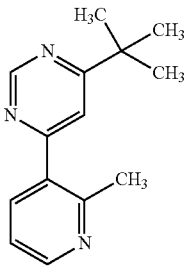

(183)
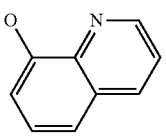

(184)
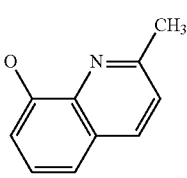

(185)
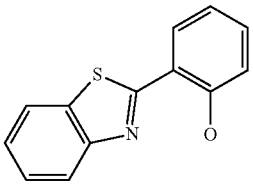

(186)
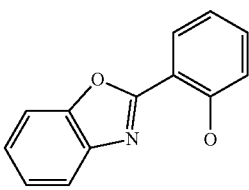

When a ligand represented by Structural Formula (100) (acetylacetone (abbreviation: acac)) is removed from a complex, a product ion having a mass-to-charge ratio obtained by subtracting 99 from precise mass of the complex is easily detected. For example, when the complex is [Ir(tBuppm)$_2$(acac)] whose precise mass is 714, a product ion of m/z=615 obtained by subtracting 99 from the precise mass is detected. Alternatively, when the complex is [Ir(dmdppr-dmp)$_2$(acac)] whose precise mass is 1074, a product ion of m/z=975 obtained by subtracting 99 from the precise mass is detected.

This indicates that a product ion formed by removing a chelate ligand such as a ligand represented by any of the above Structural Formulae (100) to (111) and Structural Formulae (120) to (126) from a complex is easily detected. That is, this indicates that a product ion from which such a chelate ligand is removed is easily detected as compared with a product ion from which a ligand forming a covalent bond with metal is removed.

In the case of using a tris-type structure in which the same ligands are bonded to each other, a mass-to-charge ratio represented by the following (Formula 2) is detected. Note that (M) represents the precise mass of a central metal, and n represents the number of ligands. Note that (P)/z has a margin of error of plus or minus 2.

$$(P)/z = \{(C)-(M)\}/n + (M) \quad \text{(Formula 2)}$$

As the central metal, iridium, platinum, silver, copper, aluminum, ruthenium, cobalt, iron, gallium, hafnium, lithium, nickel, tin, titanium, vanadium, zinc, or the like can be used.

Thus, a complex and an inorganic compound such as molybdenum oxide, lithium, and a lithium compound are preferably used, because they can be analyzed more easily when the SIMS analysis in the depth direction is also performed.

This application is based on Japanese Patent Application serial no. 2013-215721 filed with Japan Patent Office on Oct. 16, 2013, and Japanese Patent Application serial no. 2014-101204 filed with Japan Patent Office on May 15, 2014, the entire contents of which are hereby incorporated by reference.

What is claimed is:
1. A light-emitting device comprising:
a first electrode;
a first light-emitting layer over the first electrode and comprising a first light-emitting material and a first organic compound;
a second light-emitting layer over the first light-emitting layer and comprising a second light-emitting material and a second organic compound;
a third light-emitting layer over the second light-emitting layer and comprising the first light-emitting material and a third organic compound; and
a second electrode over the third light-emitting layer,
wherein:
the first light-emitting material and the second light-emitting material are different from each other,
the first light-emitting layer and the third light-emitting layer exhibit first emission,
second emission from the second light-emitting layer has an emission peak at a longer wavelength than the first emission,
the first light-emitting layer comprises the first organic compound and a fourth organic compound which form an exciplex,
the second light-emitting layer comprises the second organic compound and a fifth organic compound which form an exciplex,
the third light-emitting layer comprises the third organic compound and a sixth organic compound which form an exciplex,
the first organic compound is different from the first light-emitting material, and
the second organic compound is different from the second light-emitting material.
2. The light-emitting device according to claim 1, wherein:
each of the first organic compound, the second organic compound, and the third organic compound has hole-transport property, and
each of the fourth organic compound, the fifth organic compound, and the sixth organic compound has electron-transport property.
3. The light-emitting device according to claim 1, wherein at least one of the first emission and the second emission is phosphorescence.
4. The light-emitting device according to claim 1, wherein:
the first emission is green light, and
the second emission is red light.
5. The light-emitting device according to claim 1, wherein the first light-emitting material and the second light-emitting material individually are any one of a substance emitting fluorescence, a substance emitting phosphorescence and a thermally activated delayed fluorescence material.
6. The light-emitting device according to claim 1, wherein:
the first organic compound, the second organic compound, and the third organic compound are the same as each other, and
the fourth organic compound, the fifth organic compound, and the sixth organic compound are the same as each other.
7. An electronic device comprising the light-emitting device according to claim 1.
8. A lighting device comprising the light-emitting device according to claim 1.
9. A light-emitting device comprising:
a first electrode;
a first light-emitting layer over the first electrode and comprising a first light-emitting material and a first organic compound;
a second light-emitting layer over the first light-emitting layer and comprising a second light-emitting material and a second organic compound;
a third light-emitting layer over the second light-emitting layer and comprising the first light-emitting material and a third organic compound; and
a second electrode over the third light-emitting layer,
wherein:
the first light-emitting material and the second light-emitting material are different from each other,
the first light-emitting layer and the third light-emitting layer exhibit first emission,
second emission from the second light-emitting layer has an emission peak at a longer wavelength than the first emission,
the first emission is green light,
the first organic compound is different from the first light-emitting material, and
the second organic compound is different from the second light-emitting material.
10. The light-emitting device according to claim 9, wherein each of the first organic compound, the second organic compound, and the third organic compound has hole-transport property.
11. The light-emitting device according to claim 9, wherein at least one of the first emission and the second emission is phosphorescence.
12. The light-emitting device according to claim 9, wherein the first light-emitting material and the second light-emitting material individually are any one of a substance emitting fluorescence, a substance emitting phosphorescence and a thermally activated delayed fluorescence material.

13. The light-emitting device according to claim 9, wherein the first organic compound, the second organic compound, and the third organic compound are the same as each other.

14. An electronic device comprising the light-emitting device according to claim 9.

15. A lighting device comprising the light-emitting device according to claim 9.

* * * * *